United States Patent
Berggren et al.

(10) Patent No.: US 11,200,947 B2
(45) Date of Patent: Dec. 14, 2021

(54) SUPERCONDUCTING NANOWIRE-BASED PROGRAMMABLE PROCESSOR

(71) Applicant: Massachusetts Institute of Technology, Cambridge, MA (US)

(72) Inventors: Karl K. Berggren, Arlington, MA (US); Oguzhan Murat Onen, Boston, MA (US); Brenden Butters, Cambridge, MA (US); Emily Toomey, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/266,507

(22) Filed: Feb. 4, 2019

(65) Prior Publication Data

US 2020/0027502 A1    Jan. 23, 2020

Related U.S. Application Data

(60) Provisional application No. 62/626,591, filed on Feb. 5, 2018.

(51) Int. Cl.
| | | |
|---|---|---|
| *G11C 11/44* | (2006.01) | |
| *G11C 5/02* | (2006.01) | |
| *H01L 39/10* | (2006.01) | |
| *H01L 39/18* | (2006.01) | |
| *B82Y 10/00* | (2011.01) | |

(52) U.S. Cl.
CPC .............. *G11C 11/44* (2013.01); *G11C 5/025* (2013.01); *H01L 39/10* (2013.01); *H01L 39/18* (2013.01); *B82Y 10/00* (2013.01)

(58) Field of Classification Search
CPC ......... G11C 11/44; G11C 5/025; H01L 39/10; H01L 39/18; H01L 27/12
See application file for complete search history.

(56) References Cited

U.S. PATENT DOCUMENTS

| | | |
|---|---|---|
| 2,832,897 A | 4/1958 | Buck |
| 2,962,681 A | 11/1960 | Lentz |
| 3,283,282 A | 11/1966 | Rosenberg et al. |
| 4,028,714 A | 6/1977 | Henkels |
| 4,334,158 A | 6/1982 | Faris |

(Continued)

FOREIGN PATENT DOCUMENTS

WO   WO 2016/171875 A1   10/2016

OTHER PUBLICATIONS

PCT/US2019/016467, Aug. 20, 2020, International Preliminary Report on Patentability.

(Continued)

*Primary Examiner* — Mohammed A Bashar
(74) *Attorney, Agent, or Firm* — Wolf, Greenfield & Sacks, P.C.

(57) ABSTRACT

Apparatus and methods relating to programmable superconducting cells are described. A programmable superconducting cell can be formed from a superconducting current loop having at least two terminals connected to the loop. The current loop and terminals can be formed from a single layer of superconducting material. The programmable superconducting cell can be incorporated into a crossbar architecture to form a high-speed vector-matrix multiplying processor for deep neural network computations.

28 Claims, 9 Drawing Sheets

(56) References Cited

U.S. PATENT DOCUMENTS

| | | | |
|---|---|---|---|
| 4,371,796 | A | 2/1983 | Takada |
| 4,496,854 | A | 1/1985 | Chi et al. |
| 4,526,858 | A | 7/1985 | Luckens et al. |
| 5,051,627 | A | 9/1991 | Schneier et al. |
| 5,258,934 | A | 11/1993 | Agranat et al. |
| 5,332,722 | A | 7/1994 | Fujihira |
| 5,345,114 | A | 9/1994 | Ma et al. |
| 5,455,519 | A | 10/1995 | Ohori |
| 5,481,119 | A | 1/1996 | Higashino et al. |
| 5,831,278 | A | 11/1998 | Berkowitz |
| 6,154,044 | A | 11/2000 | Herr |
| 6,310,488 | B1 | 10/2001 | Hasegawa et al. |
| 6,549,059 | B1 | 4/2003 | Johnson |
| 6,710,343 | B2 | 3/2004 | Wood et al. |
| 6,717,451 | B1 | 4/2004 | Klein et al. |
| 6,728,131 | B2 | 4/2004 | Ustinov |
| 6,734,699 | B1 | 5/2004 | Herr et al. |
| 6,919,579 | B2 | 7/2005 | Amin et al. |
| 6,979,836 | B2 | 12/2005 | Zagoskin et al. |
| 7,283,339 | B2 | 10/2007 | Tekletsadik |
| 7,468,630 | B2 | 2/2008 | Inamdar et al. |
| 7,365,271 | B2 | 4/2008 | Knoll et al. |
| 7,728,781 | B2 | 6/2010 | Youn |
| 7,786,024 | B2 | 8/2010 | Stumbo et al. |
| 7,786,748 | B1 | 8/2010 | Herr |
| 7,879,763 | B2 | 2/2011 | Selvamanickam et al. |
| 8,571,614 | B1 | 10/2013 | Mukhanov et al. |
| 8,856,055 | B2 | 10/2014 | Brezzo et al. |
| 9,443,580 | B2 | 9/2016 | Muralimanohar et al. |
| 9,509,315 | B2 | 11/2016 | McCaughan et al. |
| 9,520,180 | B1 * | 12/2016 | Mukhanov ............... A61K 8/20 |
| 9,747,968 | B2 | 8/2017 | Ohki et al. |
| 9,780,765 | B2 | 10/2017 | Naaman et al. |
| 9,887,000 | B1 | 2/2018 | Mukhanov et al. |
| 10,171,086 | B2 | 1/2019 | McCaughan et al. |
| 10,749,097 | B2 | 8/2020 | McCaughan et al. |
| 2014/0113828 | A1 | 4/2014 | Gilbert et al. |
| 2016/0028402 | A1 | 1/2016 | McCaughan et al. |
| 2016/0028403 | A1 * | 1/2016 | McCaughan ......... H01L 39/125 326/7 |
| 2017/0186933 | A1 * | 6/2017 | Sunter ...................... G01J 1/42 |
| 2018/0090661 | A1 | 3/2018 | McCaughan et al. |

OTHER PUBLICATIONS

International Preliminary Report on Patentability for International Application No. PCT/US2019/016467 dated Aug. 20, 2020.
International Search Report and Written Opinion for International Application No. PCT/US2016/25710 dated Sep. 27, 2016.
International Search Report and Written Opinion for International Application No. PCT/US2014/023640 dated Nov. 20, 2014.
International Preliminary Report on Patentability for International Application No. PCT/US2014/023640 dated Sep. 24, 2015.
International Search Report and Written Opinion for International Application No. PCT/US2014/023664 dated Nov. 20, 2014.
International Preliminary Report on Patentability for International Application No. PCT/US2014/023664 dated Sep. 24, 2015.
Akazaki et al., A Josephson field effect transistor using an InAs-inserted-channel In0.52A10.48As/In0.53Ga0.47 As inverted modulation-doped structure. Appl Phys Lett. Jan. 15, 1996;68(3):418-20.
Annunziata et al., Reset dynamics and latching in niobium superconducting nanowire single-photon detectors. J Appl Phys. 2010;108(8):084507(1-7).
Annunziata, Single-Photon Detection, Kinetic Inductance, and Non-Equilibrium Dynamics in Niobium and Niobium Nitride Superconducting Nanowires. Yale PhD Thesis. May 2010. http://proberlab.yale.edu/sites/default/files/files/Annunziata_Thesis.pdf. 224 pages.
Buck, The cryotron—A superconductive computer component. Proc IRE. Apr. 1956;44:482-93.
Clem et al., Geometry-dependent critical currents in superconducting nanocircuits. Phys Rev B. Nov. 2011;84(17):174510 (1-27).

Doda et al., Characteristics of superconducting flux flow transistors under irradiation of femtosecond laser pulses. Physica C. 2003;392-396:1504-08.
Ejrnaes et al., Characterization of superconducting pulse discriminators based on parallel NbN nanostriplines. Supercond Sci Technol. Jan. 20, 2011;24(3):035018(1-6).
Gray, A superconducting transistor. Appl Phys Lett. Mar. 15, 1978;32(6):392-5. doi.10/1063/1.90066.
Gurevich et al., Self-heating in normal metals and superconductors. Rev Mod Phys. Oct. 1987;59(4):941-99.
Hohenwarter, Superconducting high TC thin film vortex-flow transistor. Research Report. AD-A235 025. Aug. 1. 1990 to Mar. 31, 1991. available online at www.dtic.mil/dtic/tr/fulltext/u2/a235025.pdf. 29 pages.
Hortensius et al., Critical-current reduction in thin superconducting wires due to current crowding. Appl. Phys Lett. 2012;100:182602(1-4). Epub May 3, 2012.
Hosoya et al., quantum flux parametron: A single quantum flux device for Josephson supercomputer. IEEE Trans Appl Supercond. Jun. 1991;1(2):77-89.
Kerman et al., Electrothermal feedback in superconducting nanowire single-photon detectors. Phys Rev B. 2009;79:100509R(1-4).
Klapwijk, Proximity effect from an Andreev perspective. J Supercond: Incorp Novel Magnetism. Oct. 2004;17(5):593-611.
Ko et al., Characteristics of a single-channel superconducting flux flow transistor fabricated by an AFM modification technique. Physica C. 2007;466:16-22.
Kurter et al., Microscopic examination of hot spots giving rise to nonlinearity in superconducting resonators. Phys. Rev. B. Sep. 12, 2011;84(10):104515(1-5).
Lee et al., Superconducting nanotransistor based digital logic gates. Nanotechnology. Feb. 2003;14(2):188-91. Epub Jan. 16, 2003.
Likharev, Superconductor digital electronics. Physica C. Nov. 20, 2012;482:6-18. Epub Jun. 15, 2012.
Marsili et al., Detecting single infrared photons with 93% system efficiency. Nat Photonics. Mar. 2013;7:210-14. Epub Feb. 24, 2013.
Matisoo, The tunneling cryotron—A superconductive logic element based on electron tunneling. Proceedings of the IEEE. Feb. 1967;55(2):172-80.
Morpugo et al., Hot electron tunable supercurrent. Appl Phys Lett. Feb. 23, 1998; 72(8):966-8.
Najafi et al., Timing performance of 30-nm-wide superconducting nanowire avalanche photodetectors. Appl Phys Lett. 2012;100:152602(1-4). Suppl Mater. 5 pages.
Pagano et al., Josephson junctions. Supercond Sci Technol. Dec. 1997;10(12):904-8.
Pagano et al., Nano-strip three-terminal superconducting device for cryogenic detector readout. IEEE Trans on Appl Supercond. Jun. 2011; 21(3):717-20.
Peterson et al., Self-heating hotspot effects in HTS thin films. IEEE Trans Appl Supercond. 1995;5(2): 436-9. Epub Jun. 1, 1995.
Prober, Superconducting terahertz mixer using a transition-edge microbolometer. Appl Phys Lett. Apr. 26, 1993;62(17):2119-21.
Quaranta et al., Superconductive three-terminal amplifier/discriminator. IEEE transactions on applied superconductivity. Jun. 30, 2009;19(3):367-70.
Rothwarf et al., Measurement of recombination lifetimes in superconductors. Phys Rev Lett. Jul. 1967;19(1):27-30.
Semenov et al., Analysis of the nonequilibrium photoresponse of superconducting films to pulsed radiation by use of a two-temperature model. Phys Rev B. Jul. 1, 1995;52(1):581-90.
Semenov et al., Quantum detection by current carrying superconducting film. Phys C: Supercond. Apr. 15, 2001;351(4):349-56.
Skocpol et al., Self-heating hotspots in superconducting thin-film microbridges. J Appl Phys. Sep. 1974;45(9):4054-66.
Yang et al., Modeling the electrical and thermal response of superconducting nanowire single-photon detectors. IEEE Trans on Appl Supercond. Jun. 2007;17(2):581-5.
PCT/US2019/016467, Apr. 9, 2019, Invitation to Pay Additional Fees.
PCT/US2019/016467, Jun. 27, 2019, International Search Report and Written Opinion.
Invitation to Pay Additional Fees dated Apr. 9, 2019 in connection with International Application No. PCT/US2019/016467.

(56) References Cited

OTHER PUBLICATIONS

International Search Report and Written Opinion dated Jun. 27, 2019 in connection with International Application No. PCT/US2019/016467.

Aprili, The nanoSQUID makes its debut. Nature Nanotechnology. Oct. 2006;1(1):15-16.

Burr et al., Neuromorphic computing using non-volatile memory. Advances in Physics: X. 2017; X, 2:1, 89-124.

Chen et al., Technology-design co-optimization of resistive cross-point array for accelerating learning algorithms on chip. 2015 Design, Automation & Test in Europe Conference & Exhibition (Date). 2015; p. 854-859.

Collobert et al., Natural language processing (almost) from scratch. Journal of Machine Learning Research. 2011;12(7):2493-2537.

Gokmen et al., Acceleration of deep neural network training with resistive cross-point devices: Design Considerations. Frontiers in Neuroscience. Jul. 21, 2016;10:333, 13 pages.

Gokmen et al., Training deep convolutional neural networks with resistive cross-point devices. Frontiers in Neuroscience. Oct. 2017; 11:538; 13 pages.

Kerman et al., Electrothermal feedback in superconducting nanowire single-photon detectors. The American Physical Society. Physical Review B, 2009;79(10):100509; 4 pages.

Kim et al., A functional hybrid memristor crossbar-array/CMOS system for data storage and neuromorphic applications. Nano Letters. American Chemical Society. 2012;12(1):389-395.

Krizhevsky et al., Imagenet classification with deep convolutional neural networks. NIPS. 2012; 60(6):84-90.

Lecun et al., Deep learning. Nature. May 28, 2015; 521:436-444.

McCaughan et al., A superconducting-nanowire three-terminal electrothermal device. Nano Letters. 2014; 14(10):5748-5753.

McCaughan et al., nanoSQUID operation using kinetic rather than magnetic induction. Scientific Reports. 2016;6:28095; 5 pages.

McCaughan et al., Using geometry to sense current. Nano Letters. 2016;16(12):7626-7631.

Najafabadi et al., Deep learning applications and challenges in big data analytics. Journal of Big Data. 2015; 2(1): 21 pages.

Prezioso et al., Training and operation of an integrated neuromorphic network based on metal-oxide memristors. Nature. 2015;521,7550:61-64.

Steinbuch, Die lernmatrix. Kybernetik, 1961;1(1):36-45.

Zhao et al., A compact superconducting nanowire memory element operated by nanowire cryotrons, unpublished. MIT (Found online—published Feb. 7, 2018); 20 pages.

\* cited by examiner

SUPERCONDUCTING NANOWIRE-BASED PROGRAMMABLE PROCESSOR

CROSS-REFERENCE TO RELATED APPLICATIONS

This application claims priority under 35 U.S.C. § 119(e) to U.S. provisional application No. 62/626,591, filed Feb. 5, 2018, titled "Superconducting Inductive Processor," which application is incorporated by reference in its entirety.

STATEMENT OF GOVERNMENT SUPPORT

This invention was made with Government support under Contract No. W911NF-14-C-0089 awarded by the Army Research Office (ARO). The Government has certain rights in the invention.

BACKGROUND

Technical Field

The technology relates to memory and data processing devices comprising superconducting material.

Discussion of the Related Art

Deep neural networks (DNNs) can be powerful tools in tasks such as image recognition, natural language processing and big data analytics. DNNs can be implemented using a crossbar architecture. Operation of DNNs require matrix multiplication between input values and weights stored in a weight matrix, and updating the elements in the weight matrix. Training DNNs can require a high number of matrix multiplications and require massive volumes of data transfer. Performing these operations in traditional von Neumann architectures is a computationally intensive task due to the incompatibility of the available logic and the requirements of the DNN platform. This dissonance produces a huge cost in terms of computation time and processing power, and is the main limitation faced by scaling of DNN applications. Although processors having crossbar architectures could significantly accelerate deep neural networks (DNNs), no device technology has been developed to date that can realize such an architecture with sufficient scalability and performance.

SUMMARY

An integrated programmable superconducting cell is described that is formed at least in part from superconducting material. The programmable superconducting cell can store a high number of quantized states, be used to perform mathematical operations and operate as a multi-level, non-volatile memory device. In some embodiments, a stored state can be multiplied by an input provided to the programmable superconducting cell in the form of a current or voltage ramp. A plurality of programmable superconducting cells can be incorporated in a crossbar switch architecture to form a scalable matrix multiplying processor for deep neural network computations. Example devices and methods for operating the programmable superconducting cell are described.

Some embodiments relate to a programmable superconducting cell comprising a current loop formed from a superconducting material and a nanowire constriction formed in the current loop.

Some embodiments relate to an array of programmable superconducting cells, each programmable superconducting cell comprising a current loop formed from a superconducting material and a nanowire constriction formed in the current loop.

Some embodiments relate to a method of programming a memory state of a programmable superconducting cell, the method comprising applying at least one pulse of energy to the superconducting cell that causes a nanowire constriction in a superconducting loop to transition from a superconducting state to a normal resistive state.

Some embodiments relate to a method of multiplying or dividing with a programmable superconducting cell, the method comprising: applying a current ramp to a biasing terminal that is coupled to a superconducting current loop of the programmable superconducting cell; and integrating an amount of current output from an output terminal coupled to the superconducting current loop.

Some embodiments relate to a method of performing deep neural network calculations with an array of programmable superconducting cells, the method comprising: performing a forward-pass multiplication of a vector times a matrix wherein vector inputs are provided as current ramps applied to biasing arms that are connected in rows to superconducting current loops in the programmable superconducting cells and matrix values are stored as circulating currents in the superconducting current loops; and integrating output currents from output terminals connected in columns to the superconducting current loops.

Some embodiments relate to a method of making a programmable superconducting cell, the method comprising: forming a current loop from a superconducting material on a substrate; and forming a nanowire constriction in the current loop.

Some embodiments relate to a programmable superconducting cell comprising a first superconducting device connected to a second superconducting device to form a current loop; a first write terminal connected to a first node between the first superconducting device and the second superconducting device; a first read/write terminal connected to a second node between the first superconducting device and the second superconducting device; and a second read/write terminal connected to a sensing terminal of the second superconducting device.

Some embodiments relate to a superconducting programmable memory element comprising a first superconducting device connected to a second superconducting device to form a current loop; a first write terminal connected to a first node between the first superconducting device and the second superconducting device; a read/write terminal connected to a second node between the first superconducting device and the second superconducting device; and a sensing terminal of the second superconducting device connected to the current loop.

Some embodiments relate to a programmable superconducting cell comprising a superconducting current loop and terminals connected to the superconducting current loop.

Some embodiments relate to a method of multiplying comprising applying a voltage ramp to a sensing terminal that is coupled to a superconducting current loop of a programmable superconducting cell; and integrating an amount of current output from a port coupled to the superconducting current loop.

Some embodiments relate to a crossbar processor comprising an array of unit cells arranged in rows and columns, each unit cell comprising a first superconducting device connected to a second superconducting device to form a current loop; a first write terminal connected to a first node between the first superconducting device and the second superconducting device; a first read/write terminal connected to a second node between the first superconducting device and the second superconducting device; and a second read/write terminal connected to a sensing terminal of the second superconducting device.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Processors with crossbar architectures can perform fast calculations involving vector and matrix multiplication and are suitable for use in DNNs. Because of the large amounts of data handling and training, processors based on crossbar architectures can significantly outperform conventional computing systems based on von Neumann architectures. For example, a crossbar architecture processor can reduce the computational complexity of matrix-matrix multiplication for matrices of order N from $O(N^3)$ for conventional von Neumann machines to $O(N)$ for the crossbar architecture. Additionally, processors having crossbar architectures can reduce the computational complexity for vector-matrix multiplication from as much as $O(N^2)$ to $O(1)$. Furthermore, with a recently proposed stochastic updating scheme, calculating and applying the changes (training) can be combined to also achieve $O(1)$ computational complexity (See, T. Gokmen, Y. Vlasov, "Acceleration of deep neural network training with resistive cross-point devices," *Front. Neurosci.*, 10, 333, (2016), which is incorporated herein by reference).

Figure 1:
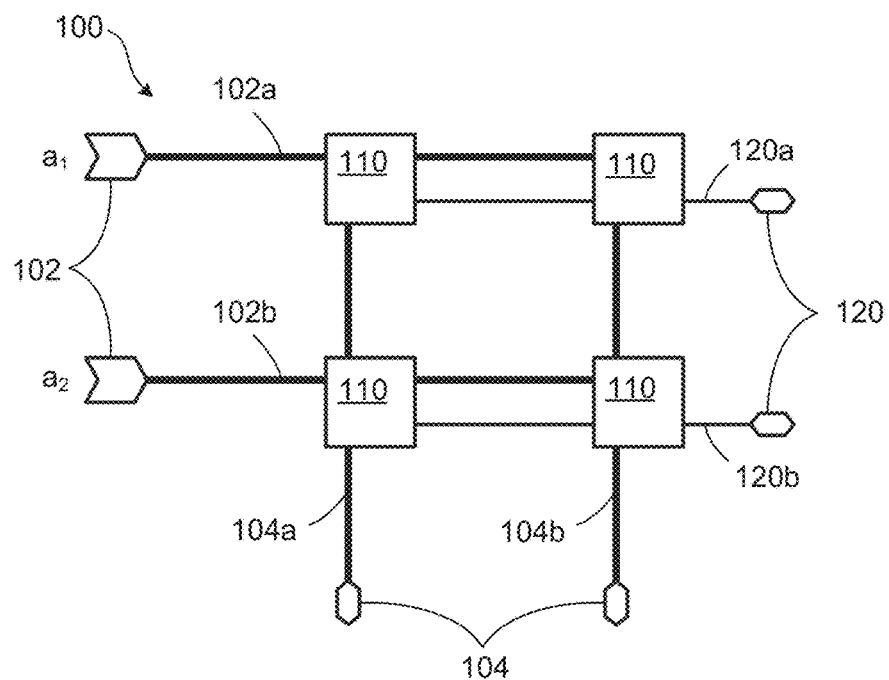
FIG. 1 depicts a simplified example of a crossbar architecture.

By way of introduction and for purposes of explanation, a generalized crossbar architecture processor 100 is depicted in FIG. 1. The illustrated processor 100 includes four cross-point devices 110, two row lines 102a, 102b, two column lines 104a, 104b, and two address lines 120a, 120b. According to some implementations, input values (e.g., values of a vector) that are to be operated on by the processor 100 may be applied to first data ports 102 and output values from an operation may be read from second data ports 104. In some cases, matrix values may be stored at the cross-point devices 110. In some implementations, the cross-point devices 110 may be configured for an operation by applying control signals to at least some of the data ports (e.g., applying control signals to third data ports 120). Regardless of how the cross-point devices are configured and signals are provided and received, an important aspect of the crossbar architecture processor 100 is that many operations can be performed concurrently and in parallel by the cross-point devices 110. Although only four cross-point devices 110 are shown in FIG. 1, the architecture can be scaled to large N×M arrays where N and M are integers and can each have a value between 2 and 10,000. In some embodiments, N and/or M may have a value greater than 10,000.

The inventors have recognized and appreciated that to take advantage of crossbar architecture properties for stochastic updating in DNN training acceleration, a cross-point device should meet at least the following performance specifications: (1) a high number of programmable states; (2) fast symmetric switching between the states; and (3) low inter-device variation. Additionally, the architecture should be able to support an all-parallel update scheme while having low noise and low power dissipation. Current technologies relating to memristive devices have not succeeded in meeting these desired performance specifications.

Figure 2A:
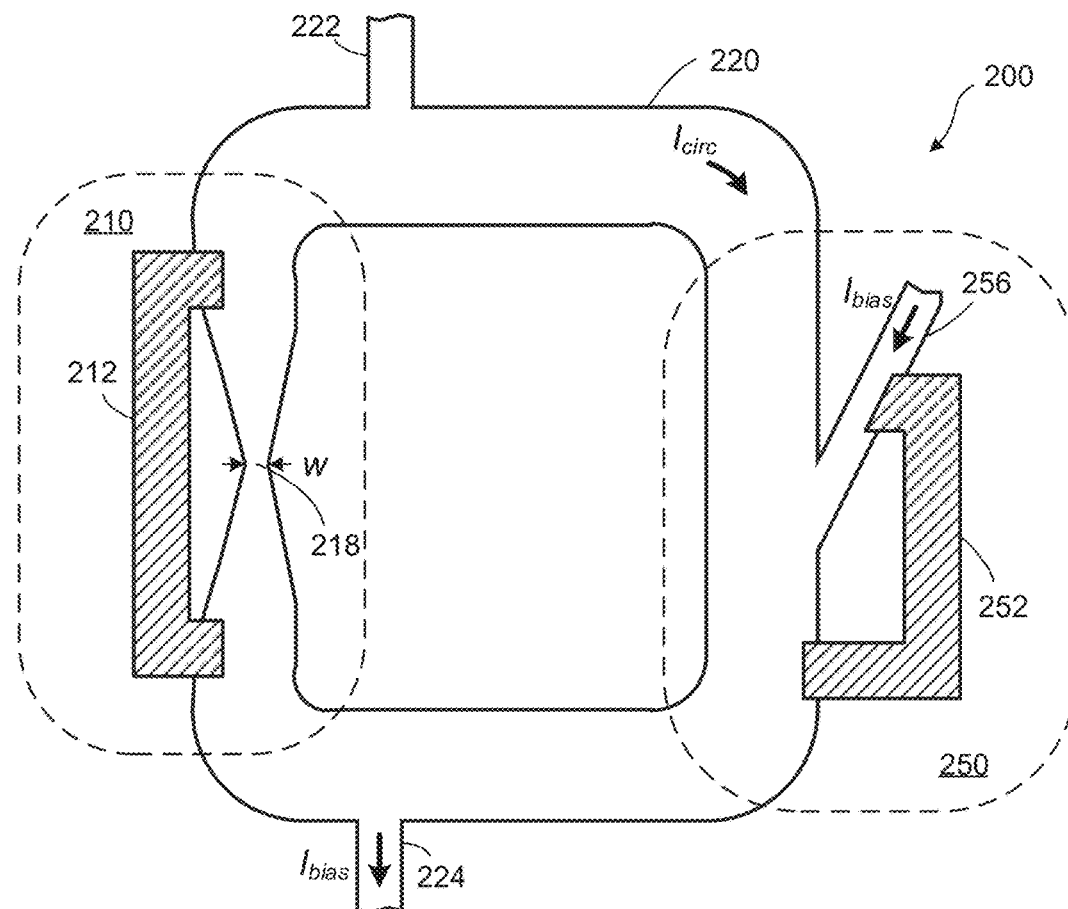
FIG. 2A depicts an example embodiment of a programmable superconducting cell.
Figure 2B:
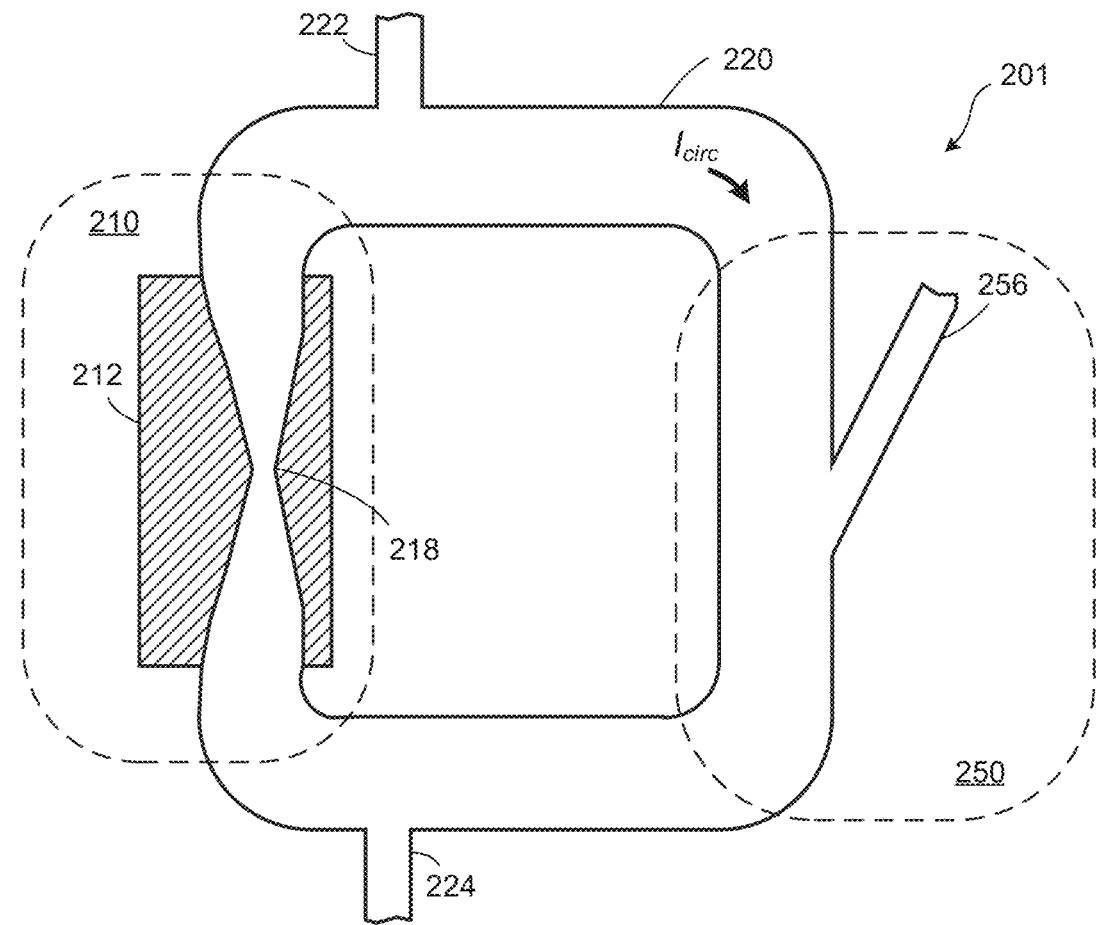
FIG. 2B depicts another example embodiment of a programmable superconducting cell.
Figure 3A:
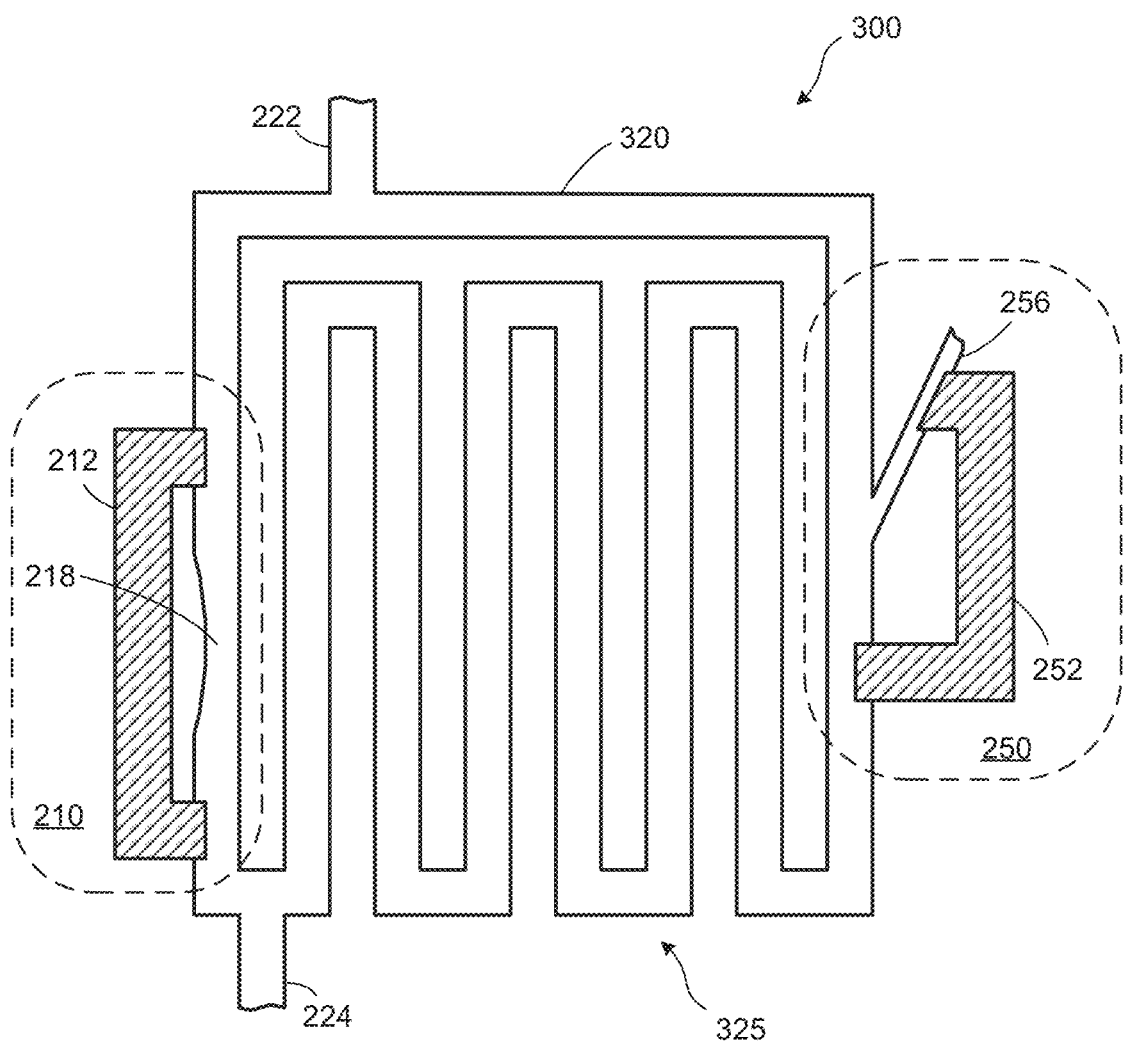
FIG. 3A depicts another example embodiment of a programmable superconducting cell.
Figure 3B:
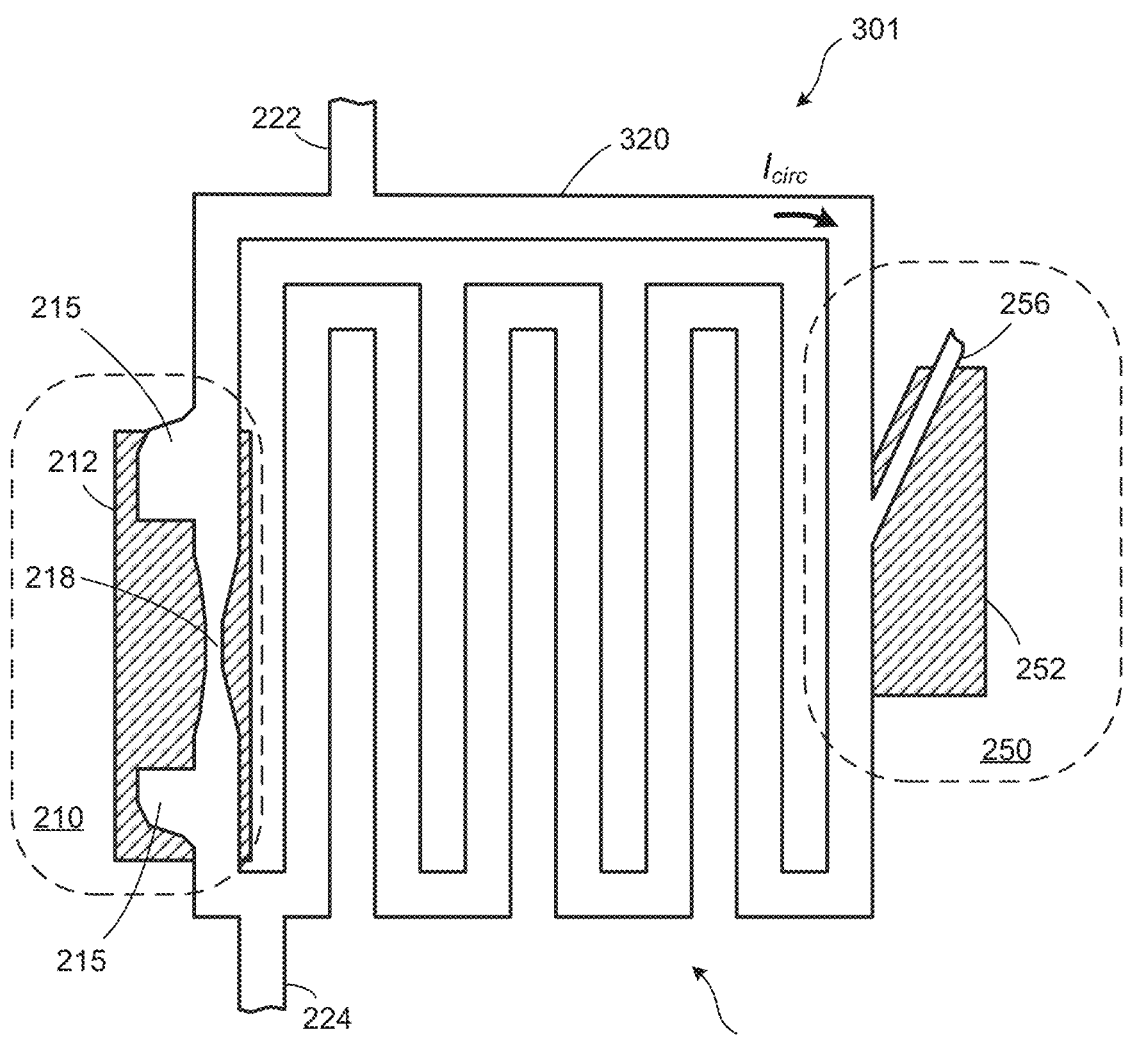
FIG. 3B depicts another example embodiment of a programmable superconducting cell.

FIG. 2A and FIG. 2B depict example embodiments of programmable superconducting cells 200, 201 that can meet the above requirements for a cross-point device 110 in a crossbar architecture adapted for DNN computations. FIG. 3A and FIG. 3B depict additional embodiments of a programmable superconducting cell 300, 301. A primary difference for the embodiments depicted in FIG. 3A and FIG. 3B is that they include a meandering portion 325 in the cell's current loop that can be added to increase the cell's inductance and number of states. The illustrated superconducting cells are not limited to use only as cross-point devices 110 in a crossbar architecture. The superconducting cells can also be used as stand-alone devices or in arrays of devices as programmable multi-state memory devices, multipliers, or dividers.

In embodiments, a programmable superconducting cell 200, 201, 300, 301 comprises a first superconducting device 210 (also referred to as a nanowire constriction switch) connected to a second superconducting device 250 (also referred to as a Y-shaped cryotron or yTron) to form a current loop 220, 320. A programmable superconducting cell can further include three terminals 222, 224, 256. A single layer of superconducting material can be used to form portions of the nanowire constriction switch 210, the yTron 250, the three terminals 222, 224, 256, and connecting regions between the nanowire constriction switch 210 and the yTron 250 that make up the current loop 220, 320. A maximum area occupied by a programmable superconducting cell 300 can be between 0.25 $\mu m^2$ and 4 $\mu m^2$, though larger and smaller sizes can be fabricated in some cases.

Figure 4A:
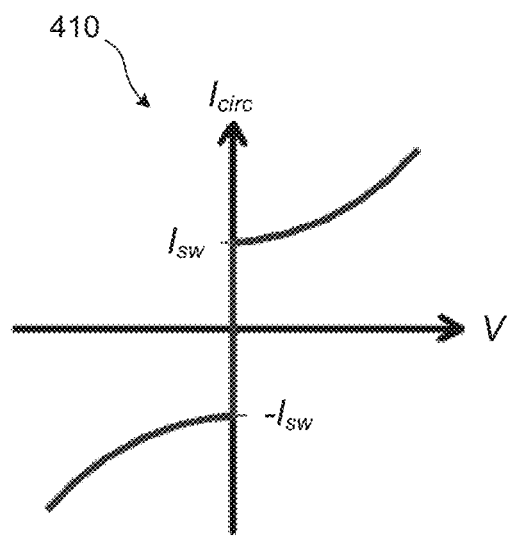
FIG. 4A illustrates an example current-voltage response of a shunted superconducting nanowire constriction.

In embodiments, the nanowire constriction switch 210 includes a nanowire constriction 218 in a length of superconducting material, and can include a low-impedance shunt 212 connected in parallel with the constriction 218 that can provide a current bypass around the constriction 218 for circulating current $I_{circ}$. The constriction 218 can be formed as a narrowing in the superconducting material (e.g. to form a nanowire) that results in a region with reduced critical current relative to the surrounding region. As circulation current through the superconducting loop 220 is increased, this region at the constriction can first exceed the critical current and switch from a superconducting state into the normal resistive state, giving a controlled and reproducible nonlinear current-voltage (I-V) characteristic, such as illustrated in FIG. 4A. A width w of the constriction at its narrowest point can be between 10 nm and 200 nm, or have a value between approximately 10 nm and approximately 200 nm.

According to some embodiments, the low-impedance shunt 212 can have a resistance between 0.5 ohm/square and 50 ohms/square and be formed from non-superconducting material. In some implementations, the total resistance of the shunt 212 may be between 0.1 ohm and 10 ohms. Example materials that can be used to form the low-impedance shunt 212 or low-impedance shunt 252 include, but are not limited to, platinum (Pt), gold (Au), chrome (Cr), nickel (Ni), tungsten (W), and titanium (Ti). Multiple layers can also be used for the low-impedance shunt 212 (e.g., Pt/Ti, Au/Ti, Au/Pt/Ti, Ni/W, Ni/Cr, etc.). A total thickness of the low-impedance shunt may be between 5 nm and 50 nm, or have a value between approximately 5 nm and approximately 50 nm. Although the low-impedance shunt 212 is depicted adjacent to the constriction 218 in FIG. 2A, the shunt may be located underneath the constriction 218 (e.g., between the constriction 218 and an underlying substrate), as depicted in FIG. 2B. Alternatively or additionally, the low-impedance shunt 212 may be located over the constriction 218 in some embodiments. Locating the low-impedance shunt 212 underneath the constriction 218 may improve electrical connection between the low-impedance shunt 212 and superconducting material used to form the constriction 218 and may also assist and/or improve heat dissipation from the constriction 218 after the constriction has switched to a normal resistive state.

The nanowire constriction switch 210 can be fabricated using planar microfabrication techniques. According to some embodiments, the nanowire constriction switch 210 can be patterned lithographically into a layer of niobium nitride (NbN, critical temperature $T_C$~10K), or may be patterned into other superconducting materials. Other materials that can be used for making the nanowire constriction switch 210 include, but are not limited to, niobium (Nb), niobium monoxide (NbO), aluminum (Al), tantalum (Ta), technetium (Tc), titanium nitride (TiN), niobium titanium nitride (NbTiN), yttrium barium copper oxide (YBCO), bismuth strontium calcium copper oxide (BSCCO), etc. or a suitable combination thereof. Device critical dimensions (e.g., width of the constriction 218 at its narrowest point) on the order of approximately 50 nm to 100 nm are typical, but can be as small as approximately 10 nm. A pattern defining the nanowire constriction switch 210 can be first defined in one or more layers of resist and transferred to the superconducting material by etching, for example. Alternatively, a pattern defining the nanowire constriction switch 210 can be first defined in one or more layers of resist and a lift-off process used to form the nanowire constriction switch 210 on the underlying substrate. The underlying substrate may comprise a silicon wafer or other semiconductor wafer, though other substrate materials can be used to implement the invention.

In some cases, a low-impedance shunt 212 or 252 can be patterned using a same or different microfabrication process that is used to pattern the nanowire constriction switch, but using a material that is non-superconducting at a temperature at which the nanowire constriction switch 210 is superconducting. The patterning of the low-impedance shunt may be performed during a separate level of lithography carried out at an earlier or later time than the level of lithography that is used to pattern the nanowire constriction switch 210. Multi-level alignment techniques can be used to align the first and second levels of lithography, so that the low-impedance shunt(s) are positioned correctly with respect to the patterned superconducting material for the two levels of lithography.

Figure 4B:
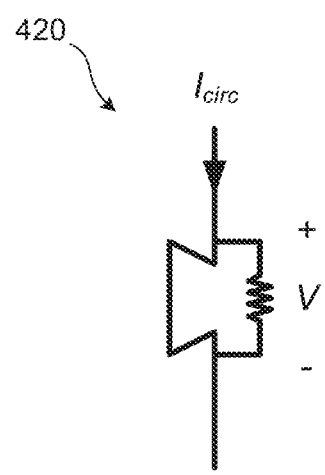
FIG. 4B depicts a circuit symbol used to represent a shunted superconducting nanowire constriction.

An I-V characteristic curve for a nanowire constriction switch 210 is illustrated in FIG. 4A. The device exhibits a strong nonlinearity. The low-impedance shunt 212 can be added to essentially eliminate thermal hysteresis in the device. As can be seen, the nanowire constriction switch 210 permits a voltage to develop across it only when biased with current above the constriction's critical or switching current (e.g., $I_{circ} > I_{sw}$ or $I_{circ} < -I_{sw}$). Hysteresis is not observed in simulations and a prototype device when current is swept in forward and reverse directions through the nanowire constriction 218. A circuit symbol 420 that can be used to schematically represent a nanowire constriction switch 210 is shown in FIG. 4B.

The yTron 250 element in a programmable superconducting cell can also be fabricated using planar microfabrication techniques as described above for the nanowire constriction switch 218. In embodiments, a yTron 250 can be fabricated from a same material, using a same process, and at a same time with the nanowire constriction 218. Materials that can be used for making the yTron 250 include, but are not limited to, niobium (Nb), niobium nitride (NbN), niobium monoxide (NbO), aluminum (Al), tantalum (Ta), technetium (Tc), titanium nitride (TiN), niobium titanium nitride (Nb-TiN), yttrium barium copper oxide (YBCO), bismuth strontium calcium copper oxide (BSCCO), etc. or a suitable combination thereof. Device critical dimensions (e.g., abruptness of sharp feature in the fork of the Y) as small as approximately 50 nm radius of curvature are typical, but can be as small as 10 nm. If used, a low-impedance shunt 252 for the yTron 250 can be patterned at a same time and using same materials and a same process that are described above and used to pattern a low-impedance shunt 212 for the nanowire constriction switch 210. Although the implementations depicted in FIG. 2A and FIG. 3A include a low-impedance shunt 252 for the yTron 250, the low-impedance shunt 252 can be omitted from any of the depicted embodiments, as illustrated in FIG. 2B. In some cases, the low-impedance shunt 252 can be located over or under the fork in the yTron, as illustrated in FIG. 3B. When present, the yTron's low-impedance shunt 252 reduces the read-out voltage across the yTron because it forms a shunt resistance in parallel with a normal resistance that appears in a bias arm that is connected to a bias terminal 256 of the yTron when the yTron switches to a normal conductive state. The reduction in total resistance can make reading of the yTron difficult. Accordingly, omitting the low-impedance shunt 252 from the yTron 250 can improve readability of circulating current $I_{circ}$ in the programmable superconducting cell 200, 201, 300, 301.

Persistent current $I_{circ}$ flowing in a superconducting loop 220, 320 of a programmable superconducting cell can be sensed non-destructively with the yTron by using a geometric effect known as current crowding (See International Patent Application PCT/US2016/025710 filed Apr. 1, 2016 and titled "Current Crowding in Three-Terminal Superconducting Devices and Related Methods," which is incorporated herein by reference). In embodiments, the yTron 250 comprises a Y-shaped current combiner, where circulating and bias currents enter from the top arms of the Y separately and exit together through an output arm or conductor. When implemented in a programmable superconducting cell 200, 300, the bias arm can be connected to a bias terminal 256 and comprise superconducting material. The other arm of the Y branch (which may be referred to as a sense arm or loop arm) and the output arm can be formed and connected integrally with the superconducting loop 220, 320 as illustrated in the drawings of FIG. 2A-FIG. 3B.

Figure 5A:
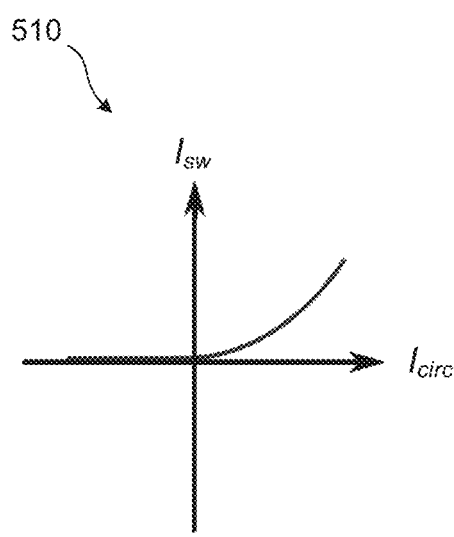
FIG. 5A depicts example switching current modulation of a y-shaped cryotron (yTron)
Figure 5B:
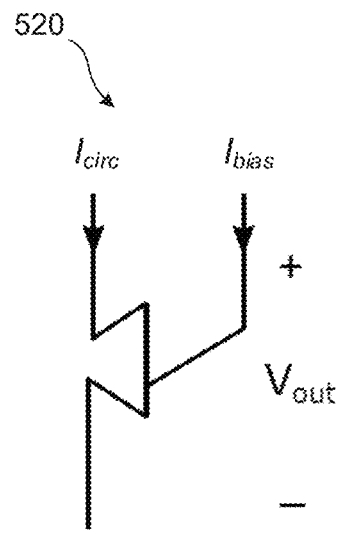
FIG. 5B depicts a circuit symbol used to represent a yTron device.

An amount of superconducting current $I_{circ}$ flowing in the current loop 220, 320 can modulate the value of a critical or switching current $I_{sw}$ received in the bias terminal 256, as illustrated by the I-V curve in FIG. 5A. For FIG. 5A, circulating current flowing in one direction only is considered. As the circulating current $I_{circ}$ increases, the switching current ($I_{sw}$) value increases. The switching current $I_{sw}$ is a value of bias current $I_{bias}$ received at the bias terminal 256 that causes a transition from superconductivity to a normal resistive state. FIG. 5A can be understood by considering current density imbalance between the loop arm and bias arm. If the current density in the bias arm becomes significantly lower than current density entering the Y fork from the loop arm, then current crowding at the forking point can cause the formation of a hot spot and normal resistance in the bias arm. When the current densities are substantially balanced, then current crowding and formation of a hot spot do not occur. Since the measurement of the switching current $I_{sw}$ at the bias terminal 256 does not break the superconducting state of circulating current $I_{circ}$ flowing in the current loop 220, 320, the circulating current $I_{circ}$ (which relates to the number of entrapped fluxons by the superconducting current loop 220,320) can be repeatedly measured without changing the state of the current loop. The yTron can be represented schematically as a constriction symbol illustrated in FIG. 5B, but with a bias arm entering at an angle.

Figure 6:
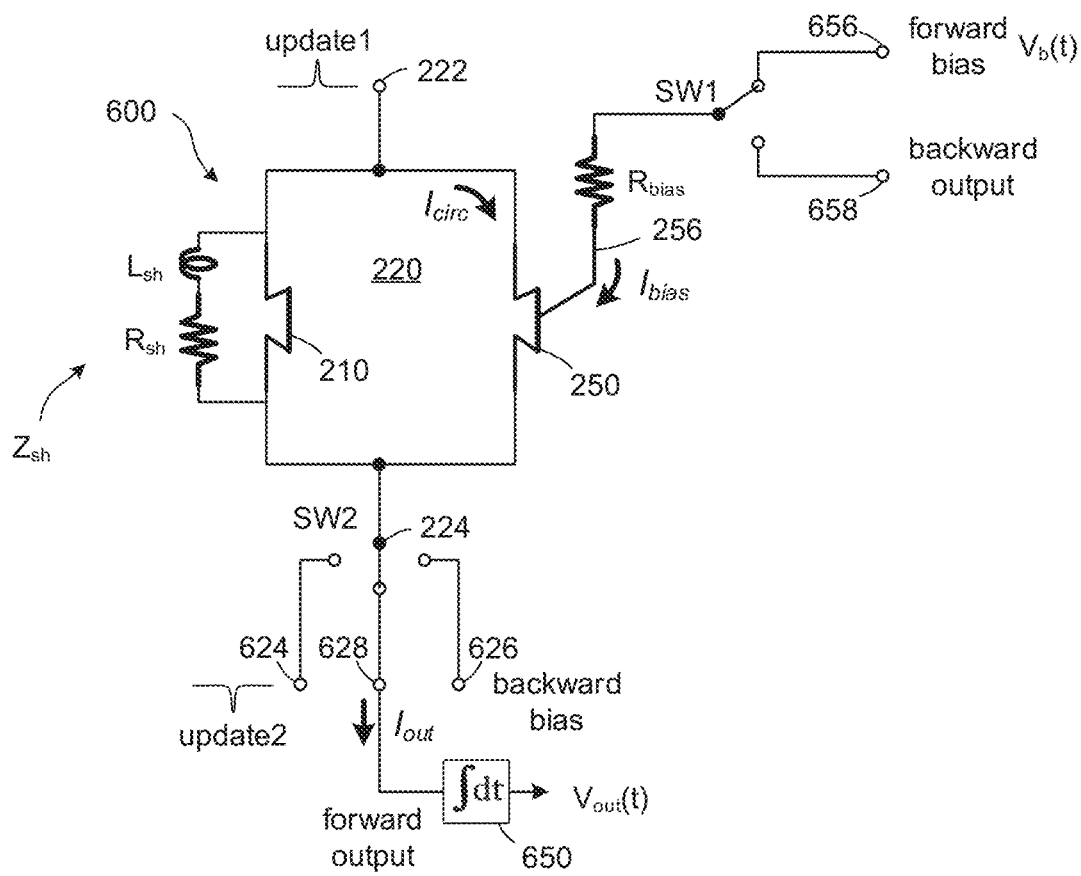
FIG. 6 illustrates an example programmable superconducting cell and related circuitry, according to some embodiments.

FIG. 6 is a circuit schematic depiction of a programmable superconducting cell 600 as it may be implemented in a crossbar architecture, according to some embodiments. The nanowire constriction switch 210 and Ytron 250 are depicted using the symbolic representations of FIG. 4B and FIG. 5B. A resistor $R_{bias}$ may be added to the bias arm to convert an applied voltage $V_b(t)$ into a bias current $I_{bias}$. According to some embodiments, $R_{bias}$ may have a resistance between 10 ohms and 75 ohms. In some implementations, the bias arm of the Ytron 250 may be configured to receive an applied bias current or provide a backward output signal. For example, a forward bias terminal 656 and backward output terminal 658 may connect to the bias arm of the Ytron 250 via a first switching element SW1. In some implementations, a first terminal 222 of the current loop 220 may be arranged to receive a first update or programming signal. A second terminal 224 of the current loop may be configured to receive a second update or programming signal, receive a backward bias signal, or provide a forward output signal. For example, a second update terminal 624, forward output terminal 628, and backward bias terminal 626 may connect to the second terminal 224 via a second switch SW2.

According to some implementations, the superconducting cell 600 comprises a nanowire constriction switch 210 that enables writing of circulating current values $I_{circ}$ to the superconducting loop 220 and a yTron 250 that enables reading of the stored circulating current for the superconducting cell 600. Persistent currents in superconducting loops can only occur in integer current values corresponding to multiples of $\Phi_o/L$, where $\Phi_o = h/2e = 2.07 \times 10^{-15}$ V-s is the flux quantum (h is Planck's constant and e the electron charge), and L is the inductance of the superconducting loop 220, 320. Accordingly, only discrete levels of circulating current $I_{circ}$ are permitted in the superconducting loop 220, such that $I_{circ}$ is quantized into N discernable states, where N is an integer. In the absence of disturbance, a superconducting loop 220, 320 can preserve its circulating current essentially indefinitely, or at least throughout the duration of computations lasting days, weeks, or even years. Since the current does not encounter any dissipative element, it flows in the loop as long as the loop remains in its superconducting state. As a result, a programmable superconducting cell 600 can provide N quantized current storage states that are inherently non-volatile, satisfying some of the criteria described above that is desired for a cross-point device 110 in a crossbar architecture. A state of the programmable superconducting cell 600 may be described and represented by the circulating current level $I_{circ}$ or by a number of fluxons trapped in the loop.

Programming of the circulating current levels $I_{circ}$ can be performed by applying a short burst of energy to the nanowire constriction 218 that causes the temperature at the constriction to momentarily exceed the superconductor's critical temperature. The burst of energy can be applied by the application of one or more electrical pulses and/or by one or more optical pulses. The illustration in FIG. 6 depicts two electrical pulses of opposite polarity (update1, update2) that can be applied to update terminals 222, 624. If the two applied pulses are coincident in time, they cause the nanowire constriction 218 to switch from a superconducting state to a normal resistive state, permitting a single fluxon, or a controlled number of fluxons, to enter the loop and increasing or decreasing $I_{circ}$ by $n\Phi_o/L$ where n is an integer value. In some implementations, n=1 for SFQ control. Individually, neither pulse is sufficient to cause the state of the loop to change. The application of two pulses is useful when the programmable superconducting cell is incorporated in a crossbar switch architecture, which is explained further below.

In alternative embodiments, a single electrical pulse having twice the energy can be applied to one of the update terminals. In yet other embodiments, an optical pulse can be focused onto the constriction 218 itself and locally heat the constriction. In some implementations, a combination of an optical pulse and electrical pulse can be applied to the constriction where the combined effect causes the constriction 218 to momentarily transition to a normal resistive (non-superconducting) state. In such embodiments where more than one pulse is applied to the programmable superconducting cell 600, the pulses should be timed to arrive simultaneously at the constriction 218. Once this transition occurs, the circulating current $I_{circ}$ may change value as magnetic flux (or fluxons) leaves or enters the loop 220. Whether the circulating current $I_{circ}$ increases or decreases depends upon the polarity of the applied electrical pulse(s).

When an optical pulse is used to switch the constriction 218, the optical pulse may be used in combination with an electrical pulse and/or direct current that is applied to the constriction. The optical pulse and applied electrical signal can be timed to arrive at the constriction concurrently. In some embodiments, the polarity of the applied electrical signal determines whether the circulating current $I_{circ}$ increments or decrements by one or more minimum current steps (or whether fluxons enter or leave the loop 220). In this manner, the optical pulses can be used to provide coincidence arrival at the nanowire constriction 218 for updating cross-point devices in the crossbar architecture.

In further detail, as the current flowing in the constriction 218 is increased above the constriction's critical current, a region of the nanowire at the constriction 218 switches to a normal resistive state. Because that portion of the superconducting loop 220 has finite resistance, any excess applied current to the update terminal 222, for example, is redirected around the loop toward the yTron 250. Additionally, circulating current can be diverted through the low-impedance shunt 212. Under the absence or reduction of current flow in the constriction 218, superconductivity is restored in the constriction and excess applied current shuttled into the loop is entrapped so that the circulating current $I_{circ}$ increases or decreases depending on the polarity of the applied current. In embodiments, an inductance of the superconducting loop 220, 320 may be larger on the side of the loop that contains the yTron 250 than on the side of the loop containing the nanowire constriction switch 210, with reference to the input terminal 222 and output terminal 224, to aid in making the switching from a superconducting state to a normal resistive state at the constriction switch 210 more deterministic, though the invention is not limited to such a configuration. In other embodiments, the inductance of the superconducting loop 220, 320 may be smaller or equivalent on the side of the loop that contains the yTron 250 than on the side of the loop containing the nanowire constriction switch 210.

For an unshunted nanowire constriction 218, the switching event can be abrupt. For example, a single switching event may load the current loop 220 to its maximum capacity before the constriction recovers its superconductivity. Locally shunting the constriction 218 with a low-impedance shunt (illustrated as $Z_{sh}$ in FIG. 6) can permit fine control over the current shuttled into the loop 220. The low-impedance shunt 218 can dampen the switching characteristics of the constriction 218 and avoid excessive current flooding into the loop all at once. If the impedance of the shunt branch is sufficiently low, current shuttling can be as fine as a single flux quantum (SFQ) $\Phi_o$. According to some embodiments, a value of the shunt resistance $R_{sh}$ is between 1 ohm and 10 ohms and a value of the shunt inductance $L_{sh}$ is between 0.1 picoHenry and 200 picoHenry. According to some implementations, a value of the shunt inductance $L_{sh}$ is between 0.1 picoHenry and 100 picoHenry. Because the states of the superconducting cell 600 are quantized and there are no stable intermediate states, the energy required to switch under SFQ control from the $N^{th}$ state to an adjacent $N^{th}+1$ state (which can be as low as a fraction of an attoJoule) is the same as the energy required to switch from the $N^{th}+1$ state to the $N^{th}$ state. Accordingly, symmetric switching of states under SFQ control is ensured, another desirable feature for a cross-point device 110 in a crossbar architecture.

Programmability of the superconducting cell 600 may also be understood in terms of magnetic field. Entrapping and releasing of fluxons can take place at the constriction 218 placed in the superconducting current loop 220, 320. When a current pulse of sufficient amplitude flows through the constriction 218, the critical current at the constriction can be exceeded and there occurs a phase slip leading to a change in the number of fluxons trapped in the loop. The polarity of the current controls the direction of the state change. When the device is in a voltage state in which there is normal resistance in the constriction 218, quanta of fluxoids can cross the constriction adding to, or subtracting from, a number of stored fluxons within the current loop 220, 320. Without being bound to a particular theory, the total fluxoid Φ crossing can be expressed as $$\Phi = \int v(t)dt \qquad (\text{EQ. 1})$$

where v(t) is the voltage across the constriction as a function of time. In this description, a fluxoid comprises effects of magnetic field flux and charge-carrier momentum.

Occurrence of a phase slip at the constriction 218 without adequate damping may lead to a flood of fluxoids entering the loop 220, 320. To control this behavior, the constriction can be shunted with a resistor 212. By shunting the constriction 218, the voltage that develops across it during switching events is constrained and switching events can be damped, resulting in control of fluxoid entry in the loop. Without damping, large hot regions can form and the number of fluxons in the loop 220, 320 can be effectively randomized during read/write cycles. Another aspect that affects the amount of fluxoids introduced to/removed from the loop is the energy value of a pulse that is used to trigger the event. In addition to surpassing the critical current, the product of the amplitude and temporal length of the pulse could correspond to a single fluxon or a controlled number of fluxons. Such pulses can be a few picoseconds wide and can be generated with pulse synthesizers developed for superconducting electronics. Such short pulses correspond to state-change clock rates on the order of 100 GHz. According to some implementations, the pulse duration for SFQ control is between 1 picosecond and 50 picoseconds.

The number of programmable states N for the superconducting cell 600 can be determined from the following expression.

$$N=I_{sw,c}/\Delta I_{circ} \qquad \text{(EQ. 2)}$$

where $I_{sw,c}$ is the switching current for the narrowest part of the loop (which is the nanowire constriction 218 in the example embodiments) and, $\Delta I_{circ}$ is the difference in circulating current between adjacent states of the superconducting cell 600. Because $\Delta I_{circ}=\Phi_o/L$ where L is the loop inductance, EQ. 2 can be rewritten as follows.

$$N=I_{sw,c}L/\Phi_0 \qquad \text{(EQ. 3)}$$

Therefore, a higher number of programmable states can be achieved by increasing the loop inductance and/or increasing the width of the constriction, which would increase $I_{sw,c}$. The geometric (magnetic) inductance that can be achieved with nanoscale devices is on the order of 100 pH, which would provide a low state density. Geometric inductance can be increased without a significant increase in device area by meandering the conductive trace in a tightly folded two-dimensional, as depicted in FIG. 3A and FIG. 3B. A tightly-folded pattern permits a wire length that scales as the device area. Geometric inductance can be increased further by forming an interconnected loop path on multiple overlapped levels in a three-dimensional pattern. Level-to-level connections may be made by conductive vias, for example.

The inventors have recognized and appreciated that the state density for a superconducting loop 320 can be significantly increased by taking advantage of kinetic inductance in loop design. Kinetic inductance arises from the inertia of the charge carriers and can be 1000 times larger than the geometric component, permitting a significant increase in state density. Unlike normal metals, some superconductors possess a high kinetic inductance, $L_k$ (arising from the inertia of the charge carriers). For such materials, the kinetic inductance can be orders of magnitude higher than the magnetic inductance. Superconducting materials with large kinetic inductance $L_k$ can provide large loop inductances and a high number of programmable states in smaller device areas than superconducting materials with low kinetic inductance. Example superconducting materials with large kinetic inductance include, but are not limited to, niobium nitride (NbN), yttrium barium copper oxide (YBCO), granular (disordered) aluminum (Al), niobium silicide (NbSi), titanium nitride (TiN), niobium titanium nitride (NbTiN). High kinetic inductance materials can be determined by examining the London parameter for each material, which is generally available, and that any material with a London parameter comparable to, or larger than that of NbN is likely to permit high kinetic inductance devices. Alternatively or additionally, kinetic inductance can be increased by forming the superconducting loop 220, 320 with nanowires (conductive traces having transverse dimensions less than 500 nm).

For loop wires dominated by kinetic inductance, $L=\Lambda l/(wd)$ where $\Lambda$ is the London parameter (i.e., the kinetic inductivity) of the superconductor, l is the length of the wire forming the loop, w is the width of the wire, and d is the thickness of the wire. The switching current $I_{sw,c}$ is related to the current density $J_C$ in the wire according to $I_{sw,c}=J_Cwd$. From these expressions the number of states in a closed loop of length l can be estimated to be $2I_{sw,c}L/\Phi_o=2J_C\lambda^2 l/(\mu_o\Phi_o)$ where $\lambda$ is the London penetration depth of the superconductor. In embodiments, approximately 200 available states per square micrometer can be obtained with the present technology, without scaling.

As will be appreciated, the number of states per area is scalable in several ways. The wire length l can be increased by reducing the wire width lithographically. $\lambda$ can be increased by moving from materials like niobium nitride ($\lambda\sim400$ nm) to materials like YBCO ($\lambda\sim1.5$ μm) or perhaps even more exotic materials. The value l could be scaled even further by stacking layers of material in three dimensions as described above.

Figure 7A:
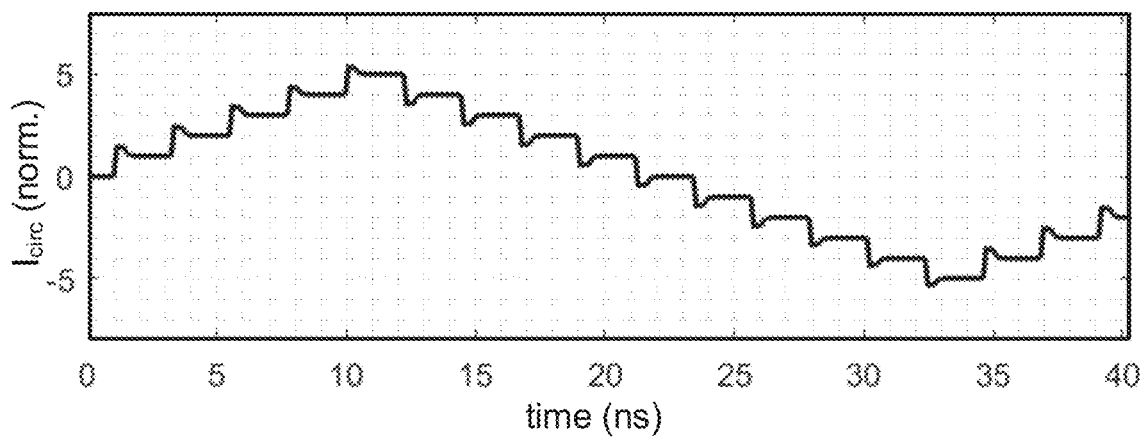
FIG. 7A illustrates an example of how stored quantized states can be programmed incrementally with SFQ steps in a symmetric way in a programmable superconducting cell.
Figure 7B:
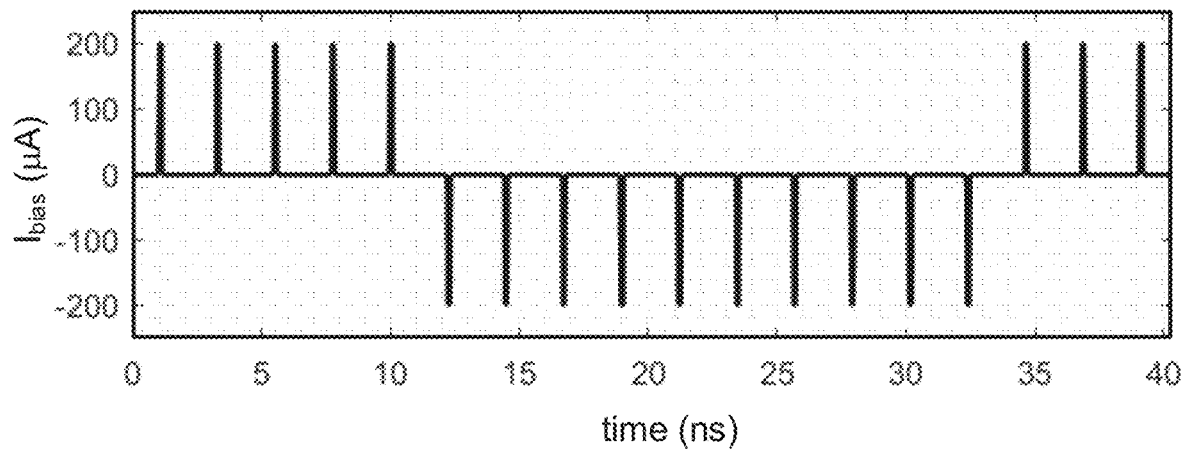
FIG. 7B depicts pulses that can be used to incrementally program quantized states in a programmable superconducting cell, according to some embodiments.
Figure 7C:
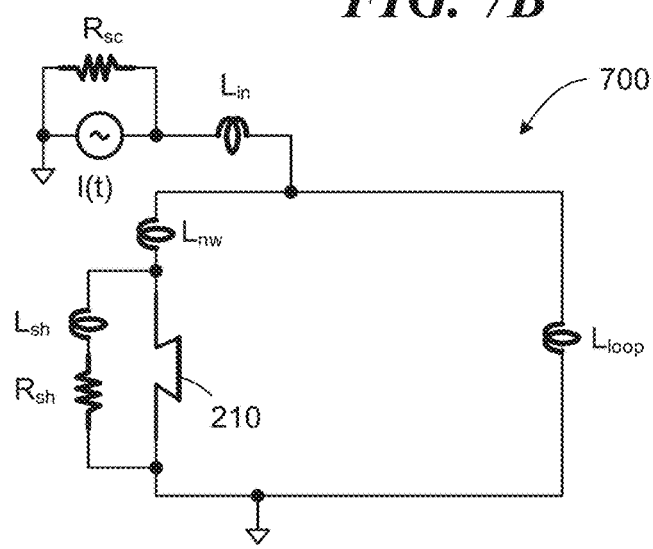
FIG. 7C depicts a circuit model used in an example electro-thermal circuit simulation for a programmable superconducting cell.

An example of quantized current states and symmetric switching between states is depicted in FIG. 7A. FIG. 7B illustrates example current pulses applied to switch the device between states, and FIG. 7C illustrates an example circuit model representation of a programmable superconducting cell that was analyzed to produce the results shown in FIG. 7A and FIG. 7B. The circuit model omits the yTron, since it was not switched during the simulation. Instead, circulating current $I_{circ}$ is monitored by the simulator through the loop inductor $L_{loop}$ and plotted in FIG. 7A. The plot in FIG. 7A shows stepping between 11 successive states (which may also be referred to as weights $W_{ij}$ for DNN applications and crossbar architectures) under SFQ control and confirms that the programmable cell can be implemented as multi-level programmable memory that can be switched incrementally and symmetrically using applied pulses of a selected energy. FIG. 7A illustrates a dependence of programmed state values (represented by $I_{circ}$) of a programmable superconducting cell's loop 220, 320 on time for a long incrementing sequence followed by a decrementing sequence and further followed by an incrementing sequence. Incrementing can be done by the application of pulses of a first polarity or polarity pair (e.g., + or +,−) as described in connection with FIG. 6. Decrementing can be done by application of pulses of a second polarity or polarity pair (e.g., − or −,+). In embodiments, the state trajectory is essentially symmetric with respect to increment and decrement operations, as illustrated in FIG. 7A.

The circuit simulator used to obtain the results in FIG. 7A and FIG. 7B is based on electrothermal dynamics described in A. J. Kerman, J. K. Yang, R. J. Molnar, E. A. Dauler, and K. K. Berggren, "Electrothermal feedback in superconducting nanowire single-photon detectors," *Physical Review B*, vol. 79, no. 10, p. 100509, 2009, which is incorporated herein by reference. Considering that the nanowire constriction switch 210 and superconducting loop 220 are not governed by quantum coherent transport, the evolution of phase is neglected. Instead, the quantization of flux in the superconducting loop is enforced when the nodal and branch quantities reach steady state (following their computation in the absence of such a constraint). Through the simulations, it is observed that, programming the cell in incremental mode (stepping through successive states without skipping a state) requires short pulse-widths (e.g., less than 1 ns duration measured as a full-width-half-maximum value). In some implementations, pulse widths for incremental programming are between 100 femtoseconds and 100 picoseconds and may depend upon the size (inductance) of the superconducting loop. The requirement of short pulses can be understood as terminating the applied pulse before the cell reaches steady-state at a next successive state, such that $I_{circ}$ is programmed to a level that is only part way to the next permitted circulating current level. By using applied pulses with low enough energy, incremental programming under SFQ control is possible with repeated application of pulses having essentially the same energy, as illustrated in FIG. 7B and FIG. 7A.

In a practical implementation, delivery of electrical pulses having durations on the order of 10 ps or less to programmable superconducting cells in a dewer may involve repeating active transmission lines, such as Josephson transmission lines (JTLs). In some implementations, JTLs can be connected to input and output terminals to transmit short electrical pulses to and from the programmable superconducting cells and interface with electronics at room temperature that are outside the superconducting environment.

Figure 8A:
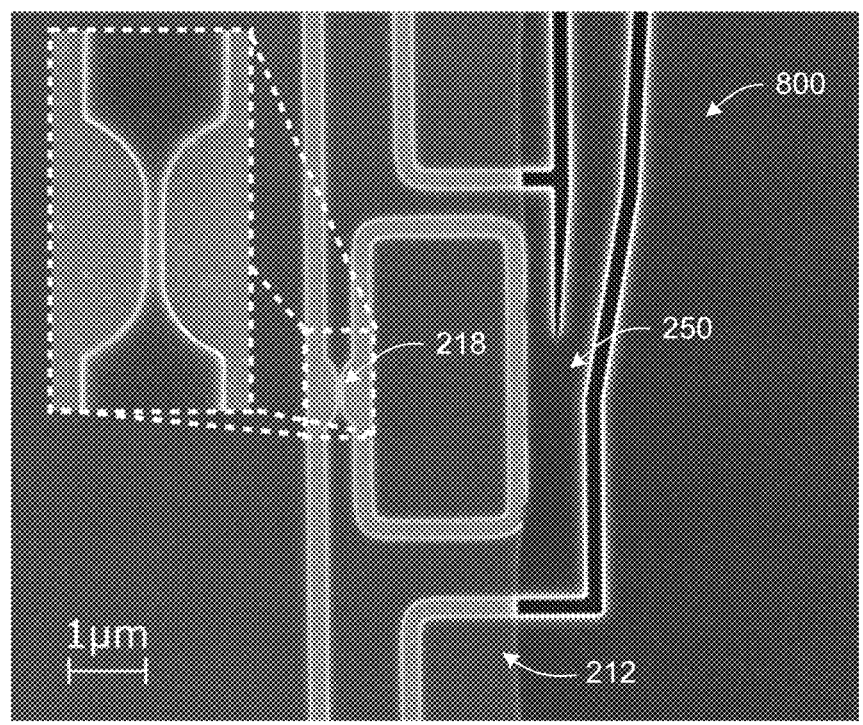
FIG. 8A is a SEM micrograph of a fabricated programmable superconducting cell having a nanowire constriction of width ~80 nm, where the brighter background indicates the presence of a Pt/Ti shunting layer behind the nanowire constriction on the left side of the device.

An example programmable superconducting cell 800 is shown in the scanning electron micrograph of FIG. 8A. The superconducting loop, nanowire constriction 218, and yTron were all patterned from a single layer of NbN approximately 25 nm thick. The low-impedance shunt 212 was formed directly under the nanowire constriction 218, and is visible as a lighter shade in the micrograph extending over a region under the left side of the programmable superconducting cell 800. The low-impedance shunt 212 comprised a 20 nm Ti layer deposited on the substrate that was covered by a 5 nm Pt layer. The width of the constriction 218 at its narrowest point was approximately 80 nm and the width of the bias arm of the yTron at the intersection of the Y fork was approximately 400 nm. The inventors have found that the width of the bias arm in the yTron should be appreciably larger than the width of the constriction 218 to avoid inadvertent switching of the yTron during programming of the superconducting cell. For example, the ratio of the width of the constriction 218 to the width of the yTron's bias arm at the intersection of the Y fork should be between 1:2 and 1:10. Further to avoid inadvertent switching of the constriction 218 from noise and to increase an amount of current in the superconducting loop, a thickness of the superconductor at the nanowire constriction 218 should be at least 10 nm. In some implementations, a thickness of the superconductor at the constriction 218 is between 10 nm and 50 nm. The example programmable superconducting cell 800 occupies an area of approximately 4 microns by 6 microns. According to some embodiments, an area of a programmable superconducting cell may be between 10 square microns and 50 square microns, though larger or smaller devices can be used in some implementations.

Figure 8B:
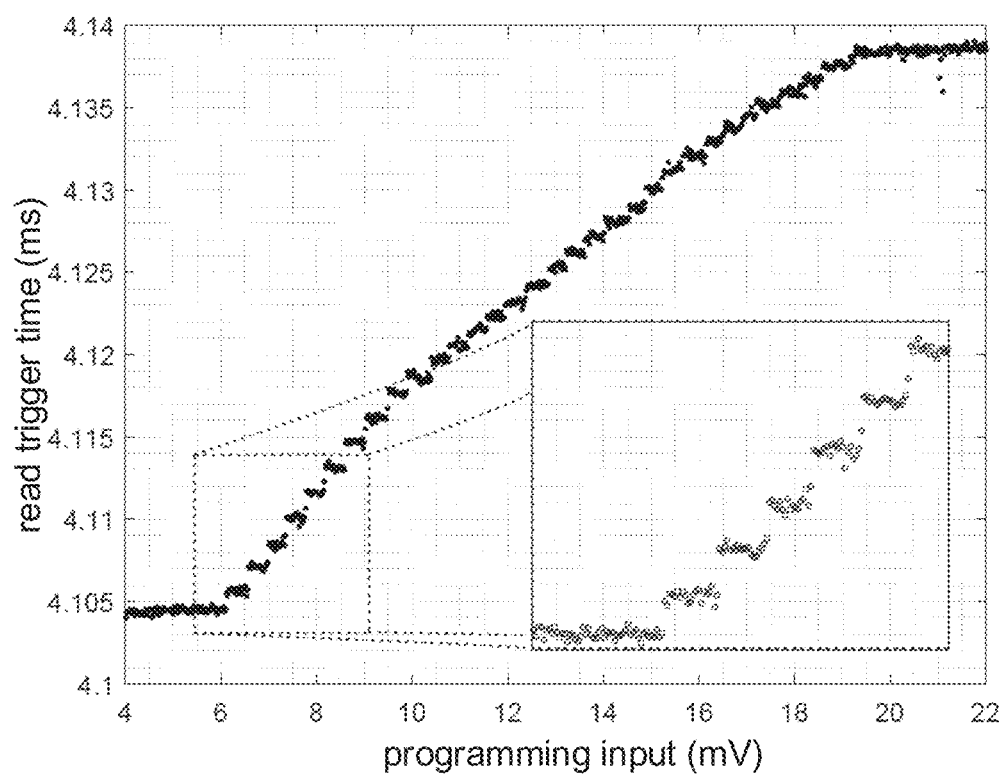
FIG. 8B shows measurement results that plot the state of the programmable superconducting cell of FIG. 8A as a function of programming input.

Programmability and quantization of stored current levels or flux as measured for the programmable superconducting cell 800 can be seen in FIG. 8B. The plot in FIG. 8B represents multiple measurements of switching levels in a bias arm 256 of a yTron connected in a programmable superconducting cell for different levels of circulating current $I_{circ}$ in the superconducting loop 220. The switching levels are determined by recording the time at which the bias arm switches upon application of a ramped current. Each data point represents an average of 50 consecutive measurements. The standard deviation of the reads were significantly smaller than the incremental step height, so that single reads could be used in some embodiments. The plot in FIG. 8B indicates that approximately 33 discrete states, corresponding to 33 different amounts of entrapped fluxons, could be resolved for this device, and that the superconducting loop could be read without destroying the stored superconducting states. The states were programmed by applying voltage pulses to the inputs of the programmable superconducting cell 800 to switch the nanowire constriction 218 as described above. Because of limitations with the pulse generator, the minimum step between storage states of superconducting loop 220 corresponds to a single flux quantum transition. However, in the experiment, applied pulses of different heights were used to access the different states (e.g., from a zero state) due to limitations of the pulse generator used. With improved pulse generation, a significantly larger number of states may be accessible for the programmable superconducting cell 800. Further, the states may be accessed in an incremental mode of programming where a same amplitude pulse (corresponding to a SFQ transition) is applied one or more times to access a desired state. The inventors found that nonlinearity and noise_in the yTron behavior during read-out limits resolution of the states more for higher energy states than lower energy states. Improvements in yTron design may improve resolution of the states.

In addition to providing multi-level memory, a programmable superconducting cell 600 can also be used to carry out multiplication and update operations for DNN computations. In a conventional crossbar architecture that uses resistive cross-point elements, analog multiplication can be performed using Ohm's law where an operand or weight can be represented by the conductance of a cross-point element. In such a case, the contribution from each element in a column is combined at the ends of columns via Kirchoff's law. Other operands can be applied as voltage inputs to rows, thereby forming a vector-matrix product.

Figure 9A:
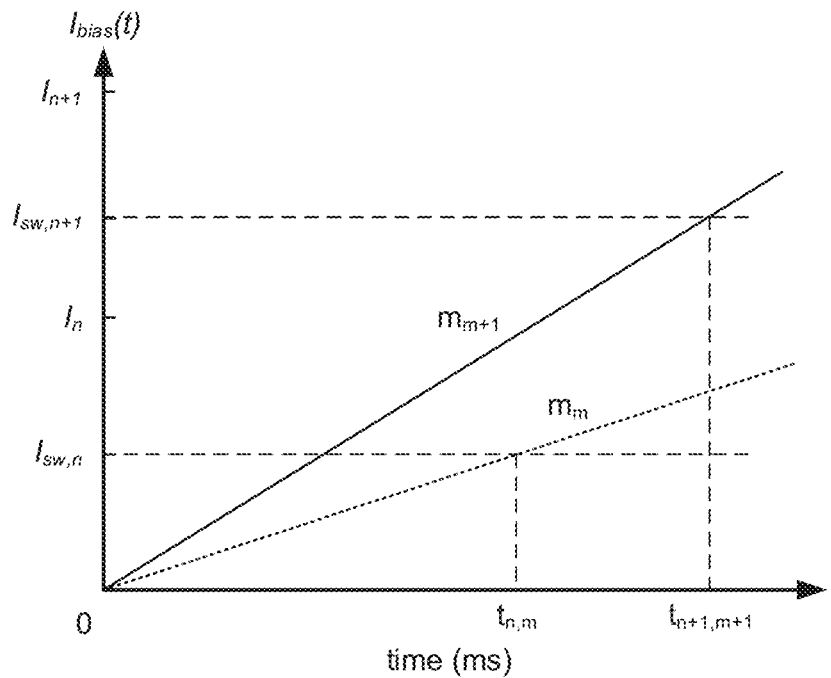
FIG. 9A illustrates example current ramps that can be used to perform a multiplication or division operation.
Figure 9B:
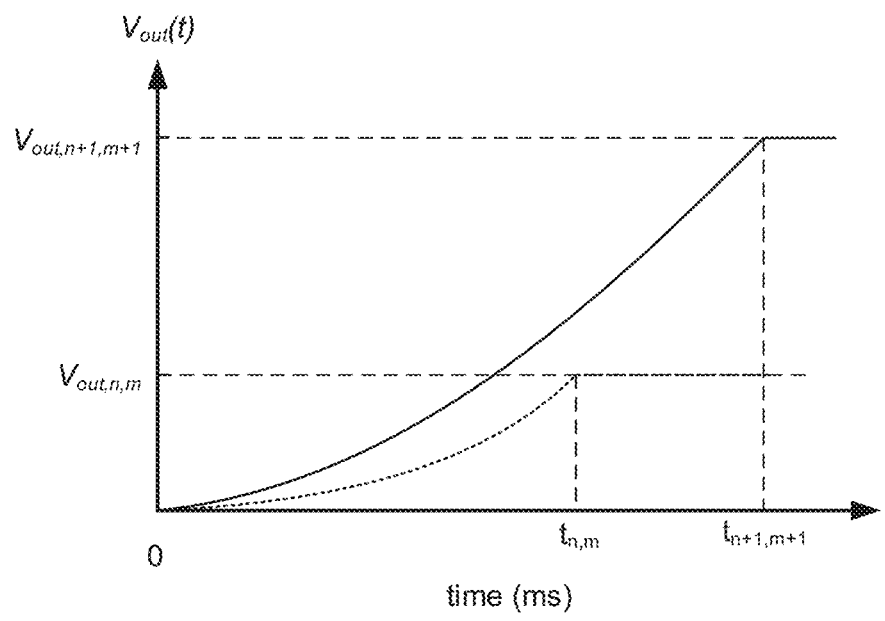
FIG. 9B depicts example outputs from a multiplication or division operation.

For the superconducting cross-point devices described herein, with infinite conductance, a new approach to implement multiplication or updating operations is used. In embodiments, an input value to a programmable superconducting cell 600, referring again to FIG. 6, can be multiplied by a value stored in the superconducting loop 220. The plots of FIG. 9A and FIG. 9B aid in understanding how multiplication operations can be performed with a programmable superconducting cell 600. In FIG. 9A, examples of applied bias currents to the yTron bias arm are plotted. In FIG. 9B, example integrated outputs derived from current flowing out a terminal 224 of the programmable superconducting cell 600 are plotted.

According to some embodiments, an input operand for multiplication can be represented as an applied current or voltage ramp (instead of constant applied signal for a conventional resistive cross-bar architecture). An applied voltage ramp can be converted into current at each yTron bias terminal 256 with the use of a series resistor $R_{bias}$. In response to the applied current ramp at the yTron bias terminal 256, the yTron's bias arm switches at a current level that is determined by the state, or amount of circulating current $I_{circ}$ in the superconducting loop 220, for that programmable cell. Once the bias arm in the yTron switches to a normal resistive state, a large resulting resistance in the bias arm (e.g., between 500 ohms and 5 kiloohms) will result in a precipitous drop of current flowing into the yTron and out the output terminal 224. An output value for the multiplication operation can be determined from an integration of current $I_{out}$ flowing out the output terminal by an integrating circuit 650.

Two example multiplication operations are indicated by the plots in FIG. 9A and FIG. 9B. For the first multiplication operation, a first state $W_n$ of the programmable superconducting cell 600 can be represented by a first circulating current value $I_n$ within the superconducting loop 220. At this circulating current value, the bias arm of the yTron 250 may switch at an applied current value of $I_{sw,n}$. When a first applied current ramp of $m_m$ (indicated by the dashed line) is applied to the yTron bias terminal 256, the bias arm of the yTron will switch when the applied bias current reaches the value $I_{sw,n}$ at time $t_{n,m}$. The integrated output current $I_{out}$ from the output terminal 224 will produce a voltage waveform like that shown in FIG. 9B (indicated by the dashed curve). The detected voltage climbs to a value $V_{out,n,m}$, and then remains approximately constant after the yTron's bias arm switches at time $t_{n,m}$. In some implementations, the detected voltage may increase slightly after switching of the yTron's bias arm if a small residual current flows through the switched bias arm. The solid line and curve in FIG. 9A and FIG. 9B are an example for a different multiplication operation for which a different input current ramp $m_{m+1}$ is applied and the programmable superconducting cell 600 is in a different state $W_{n+1}$ that can be represented by $I_{n+1}$. When the programmable cell is in a higher current state, the bias arm switches at a later time $t_{n+1,m+1}$ producing a different integrated output voltage $V_{out,n+1,m+1}$.

Although only positive current ramps are shown in FIG. 9A, negative current ramps can be applied and negative values of $I_{circ}$ can be used to increase the number of states accessible by the programmable superconducting cell 600. According to some embodiments and referring again to FIG. 6, a negative bias may be applied by applying a positive current ramp to the backward bias terminal 626 and integrating a current received from the backward output terminal 658.

Without being bound to a particular theory, it can be analytically calculated that the integrated output is proportional to the product of the square of the cell state $W_i$ (e.g., a value proportional to the circulating current value $I_{circ}$ for the superconducting loop, $W_i \propto I_{circ,i}$) and the applied input as expressed in the following expression $$V_{out,i,j} \propto W_i^2 / m_j \qquad (EQ.\ 4)$$

where $m_j$ is the slope of the applied current ramp. Alternatively, $W_i$ is proportional to the number of stored fluxons and can be expressed in terms of number of stored fluxons in the superconducting loop. The value of $m_j$ can be taken as the change in applied current divided by the corresponding change in time over which the applied current changes ($\Delta I_{bias}/\Delta t$).

For example and referring to FIG. 9A, it can be shown that the integrated output current (e.g., accumulated at a capacitor) provides an output voltage $V_{out,i,j}$ for the $i^{th}$ state and the $j^{th}$ input that is proportional to the integral of the applied bias ramp $I_{bias}(t)$, which can be written as the product of the ramp's slope $m_j$ times time t. The result of the integration, which essentially terminates at $t_{i,j}$ (an effective upper bound of the integration), is a value proportional to $I_{sw,i} \times t_{i,j}$ or the area of the triangular ramp in FIG. 9A. In some implementations (e.g., when a repetition frequency of the applied biasing ramp is held constant), $m_j$ can be represented as the amplitude of the applied current ramp. In yet other embodiments, the applied bias may have a fixed ramp amplitude that accesses all possible states stored by the programmable cell, and $V_{out,i,j}$ may be proportional to the product of the state value $W_i$ and the period $T_j$ of the applied bias.

For multiplication, one multiplicand can be provided as $1/m_j$ and the square root of the other multiplicand can be represented as $W_i$. For a deep neural network, the operation of EQ. 4 can be used also for training the DNN. For example, one input can be fed as $1/m_j$ to compensate for the division, and then the training algorithm can be modified while computing gradients to compensate for the square term. Therefore the transfer function of a programmable superconducting cell 600 used in a multiplication operation is well-suited for the DNN application. It will also be appreciated that the programmable superconducting cell 600 can be used as a divider where the square root of the dividend can be represented as $W_i$ and the divisor can be represented by the slope m of the applied current ramp.

Although described above for processing operations (e.g., multiplication, division, updating), in some implementations a programmable superconducting cell 200, 300 can be used as an addressable memory element alone or in an array and may not be used for processing operations. In memory embodiments, programmable superconducting cells may be fabricated in an N×M array, where N and M are integers. In some cases, there may be multiple arrays formed on different and overlapping levels of lithography. In such applications, each programmable superconducting cell may appear as shown in FIG. 6 and FIG. 10, except the cells may not have a backward output terminal 658, a first switch SW1, and a backward bias terminal 626.

Figure 10:
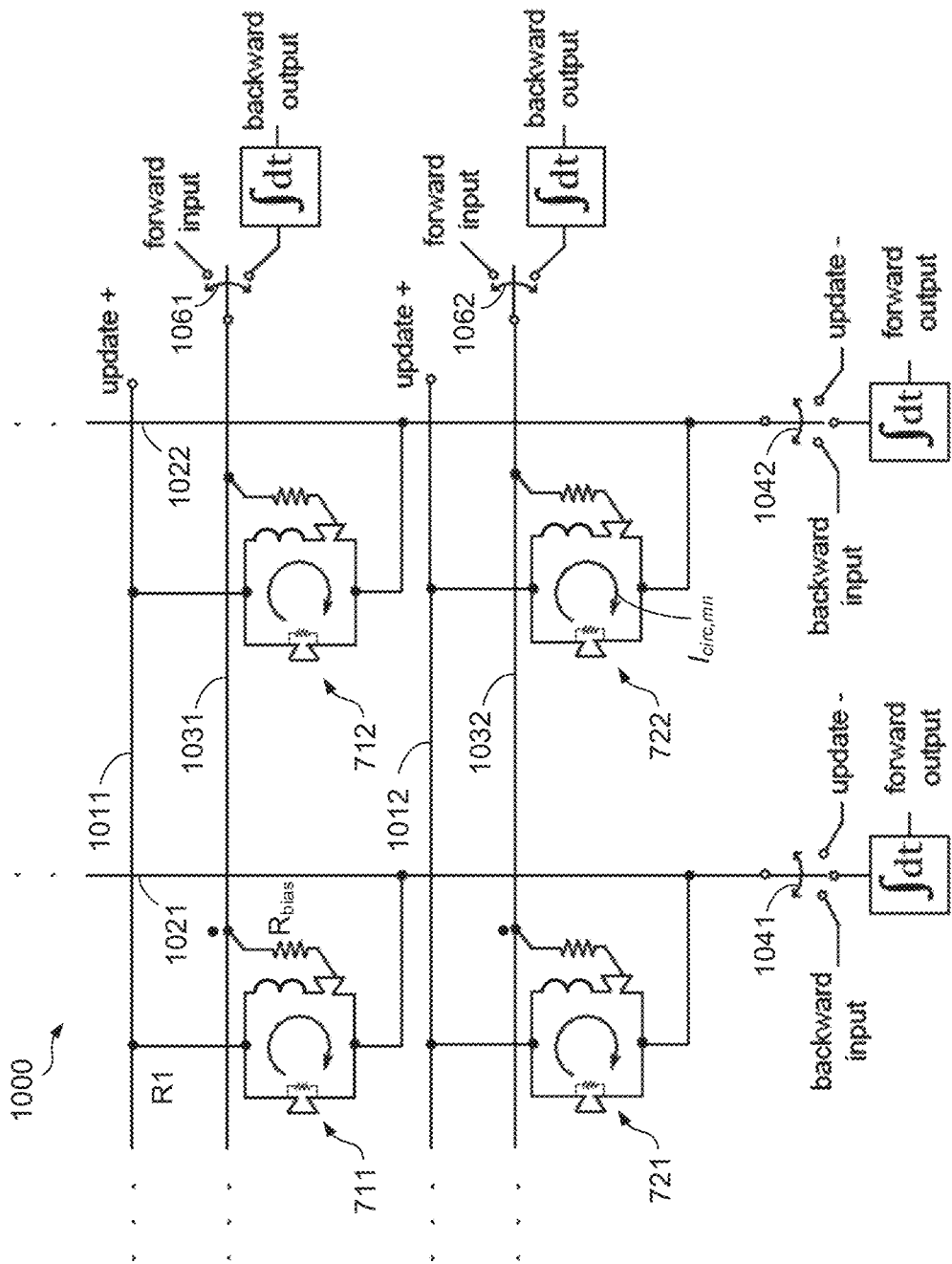
FIG. 10 depicts an example of a superconducting crossbar architecture that can be used for high-speed matrix multiplications to significantly accelerate training of deep neural networks.

FIG. 10 depicts a portion of an N×M array 1000 of programmable superconducting cells 711, 712, 721, 722 connected together in a crossbar architecture. In the illustrated circuit schematic, inductances of the superconducting loops are depicted using inductor symbols. The illustrated architecture includes forward and backward bias input terminals for the bias arms on the devices' yTrons. The architecture further includes forward and backward output terminals for integrating current received from each device in response to applied bias ramps for multiplication, division, or updating operations. The architecture is adapted to be compatible with a stochastic update scheme. For example, the illustrated architecture is devised to support training with stochastic gradient descent (SGD) using a backpropagation algorithm to compute the derivatives in three operation cycles: a forward pass operation, backward pass operation, and an update. The illustrated array 100 may be used for DNN applications, for example.

According to some implementations, write or update lines 1011, 1012 can connect input terminals 222 of the programmable superconducting cells in rows. The update lines 1011, 1012 can be connected to updating terminals (update+) at which voltage pulses can be applied for programming the programmable superconducting cells. First input/output (IO) lines 1021, 1022 can connect output terminals 224 in columns of the programmable superconducting cells. The first IO lines 1021, 1022 may connect to switches 1041, 1042 that allow connection to one of three terminals (backward input terminal, forward output terminal and integrating circuit, and update− terminal). The forward output and integrating terminal can be used to integrate summed output current from all cross-point devices in a column. The backward input terminal can be used to apply a bias ramp (positive or negative slope) to the yTrons in a column. The update-terminal can be used to apply a programming pulse to one or more cross-point devices in a column.

Second IO lines 1031, 1032 can connect bias terminals 256 of the programmable superconducting cells in rows. The second IO lines 1031, 1032 may connect to second switches 1061, 1062 that are arranged to provide connection to a forward input terminal or backward output and integrating terminal, as illustrated. The forward input terminal can be used to apply a bias ramp (positive or negative polarity) to the yTrons' biasing arms in a row. The backward output can be used to integrate current received from all yTron biasing arms in a row. Resistances ($R_{bias}$) can be used to convert voltage to current (which flows into the yTrons' biasing arms) and prevent redistribution of current along the line which would otherwise occur if current ramps were applied to the first and second IO lines 1021, 1022, 1031, 1032 without the presence of resistors $R_{bias}$. Though only four programmable superconducting cells are shown, there can be hundreds, thousands, or even millions of programmable superconducting cells in an array 1000. In embodiments, update lines and IO lines may receive or transmit signals from or to electronics located outside the cryogenic environment. In such cases, the lines may include repeaters and/or Josephson transmission lines, particularly if the line carries short pulses (e.g., pulses having FWHM values less than 1 nanosecond).

In some embodiments, the array 1000 can be used for vector-matrix or matrix-matrix multiplication for DNN computations. A vector-matrix multiplication can comprise multiplying elements of a vector by a matrix. The vector may be represented by biasing inputs applied to rows (e.g., applied to the forward input terminals and IO lines 1031, 1032). The matrix values (also referred to as weights for DNN computations) can be represented by the stored fluxon or circulating current values at each programmable cell in the array 1000. A vector×matrix operation can comprise at least two steps: (1) programming stored fluxon or circulating current values in the array 1000 of programmable superconducting cells 711, 712, 721, 722 and (2) performing a forward-pass multiplication, as described above in connection with FIG. 9A and FIG. 9B. For a matrix-matrix multiplication, rows of a matrix may be multiplied sequentially as a series of vector-matrix operations.

For DNN computations, a third step of (3) performing a backward-pass multiplication can be performed. In this step, a calculation of the backward pass can be done by employing the same method of the forward pass or forward vector-matrix or matrix-matrix multiplication described above, however using the backward input terminals and backward output terminals and inverted input signs for the applied ramp biases. In this manner, the transpose of the weight matrix can be obtained. The backward-pass multiplication is essentially equivalent to a vector-matrix multiplication where the matrix is the transpose of the original weight matrix stored in the array 1000, without physically modifying the original matrix. Physically transposing the original weight matrix would be computationally expensive. For such computations that may be used for DNN training, the consequence of the $W_i^2$ terms can be tolerated. The inventors have found that the presence of $W_i^2$ terms rather than $W_i$ terms in EQ. 4 leads to a weight-dependent learning rate for each cell, but does not significantly deteriorate the training performance of the DNN.

Updating of the programmable cells in the array can follow a stochastic update scheme with the application of pulses from rows and columns with opposite signs (as illustrated in FIG. 6 for a single cell). Pulses that are coincident in time provide sufficient current to switch the shunted constriction 218 at a cell into normal state. This switching can shuttle an incremental current into, or out of, the cell's loop depending on the input polarity of pulses, as explained above. Individual pulses are thresholded by the switching current $I_{sw,c}$ of the constriction 218 and do not lead to any change in the state of a cell receiving one pulse. This scheme satisfies the AND operation requirement of the training method for implicit and all-parallel calculation of the update.

It can be appreciated that unit cells in the crossbar array 1000 act as local information processors. To permit matrix multiplication, each unit cell has a transfer function such that the input is multiplied with the cell's state. The ability to perform all three operations described above (programming or updating, forward-pass multiplication, and backward-pass multiplication) allow the usage of the crossbar architecture, exemplified in FIG. 10, to perform training through a backpropagation algorithm with all operations (vector-matrix multiplication and tuning the stored matrix values) with O(1) computational complexity.

In some embodiments, a backpropagation algorithm can comprise a number of steps involving one or more crossbar architecture arrays, an example of which is depicted in FIG. 10, that can be included in a neural network. In some cases, input matrix values can be fed to a crossbar (row by row). After a vector-matrix multiplication in forward pass, the outputs can be gathered. The outputs can processed externally (e.g., by any suitable digital processor) by applying nonlinear functions (e.g., activation and cost functions) resulting in an output vector. The output vector can be fed backwards through the system for a backward-pass multiplication, where the transpose of the each weight matrix is required for a DNN training algorithm. The result of the backward-pass vector-matrix multiplication can be sent for external processing where again nonlinear functions are applied, resulting in a second output vector. The first output vector and second output vector can then be used to obtain an outer-product comprising a correction matrix of the same size as the initial weight matrix. The correction matrix can then be used to tune or update the initial weight matrix (sometimes referred to as training).

Peripheral circuitry for the crossbar-architecture array 1000 can be built using available technologies such as cryo-compatible CMOS and Josephson Junctions (JJs). Additional elements used for integration in a cryogenic environment can include, but are not limited to, Josephson transmission lines, integrators, analog-to-digital converters (ADCs), and non-linear function evaluators (e.g. a central processing unit (CPU) such as a microprocessor or an application specific integrated circuit (ASIC)). The illustrated architecture in FIG. 10 may be used to accelerate training of Restricted Boltzmann Machines (RBMs), fully connected neural networks, convolutional neural networks (CNNs), recurrent neural networks (RNNs), and LSTM Networks.

Superconducting programmable cells can be embodied in different configurations. Example configurations include combinations of configurations (1) through (10) as described below.

(1) A programmable superconducting cell comprising a current loop formed from a superconducting material and a nanowire constriction formed in the current loop.

(2) The programmable superconducting cell of configuration (1), further comprising a low-impedance shunt connected to the current loop in parallel with the nanowire constriction.

(3) The programmable superconducting cell of configuration (1) or (2), wherein a resistance value of the low-impedance shunt is between 0.1 ohm and 10 ohms and an inductance value of the low-impedance shunt is between 0.1 picoHenry and 100 picoHenry.

(4) The programmable superconducting cell of any one of configurations (1) through (3), further comprising an input terminal connected to the current loop, an output terminal connected to the current loop, and a biasing arm and bias terminal connected to the current loop.

(5) The programmable superconducting cell of any one of configurations (1) through (4), wherein the biasing arm is formed from the superconducting material and forms a portion of a yTron that is integrated in the current loop.

(6) The programmable superconducting cell of any one of configurations (1) through (5), wherein a width of the biasing arm is greater than a width of the nanowire constriction.

(7) The programmable superconducting cell of any one of configurations (1) through (6), further comprising a resistor connected to the bias terminal having a value between 10 ohms and 75 ohms.

(8) The programmable superconducting cell of any one of configurations (1) through (7), wherein a width of the nanowire constriction is between 10 nm and 200 nm.

(9) The programmable superconducting cell of any one of configurations (1) through (8) configured for multi-level memory.

(10) The programmable superconducting cell of any one of configurations (1) through (9) configured for multiplication and/or division operations.

Superconducting programmable cells can be embodied in different configurations. Example configurations include combinations of configurations (11) through (17) as described below. Any of the features in configurations (1) through (10) may be included in any of the configurations (11) through (17).

(11) An array of programmable superconducting cells, each programmable superconducting cell comprising a current loop formed from a superconducting material; and a nanowire constriction formed in the current loop.

(12) The array of configuration (11), configured for multi-level memory storage.

(13) The array of configuration (11) or (12), configured for vector-matrix multiplication.

(14) The array of any one of configurations (11) through (13), configured in a crossbar architecture for deep neural network computation.

(15) The array of any one of configurations (11) through (14), wherein each programmable superconducting cell further comprises a low-impedance shunt connected to the current loop in parallel with the nanowire constriction, an input terminal connected to the current loop, an output terminal connected to the current loop, and a biasing arm, resistor, and bias terminal connected to the current loop.

(16) The array of any one of configurations (11) through (15), further comprising first lines connecting the input terminals in first rows, second lines connecting the output terminals in columns, and third lines connecting the bias terminals in second rows.

(17) The array of any one of configurations (11) through (16), wherein the second lines and third lines are configured as input/output lines.

Methods of operating and making programmable superconducting cells are also provided. Example methods are described in method embodiments (18) through (32) below. The methods may be implement on apparatus configurations (1) through (17) above, and features of the apparatus in configurations (1) through (17) may be present in a device on which any of the method embodiments (18) through (32) are practiced.

(18) A method of programming a memory state of a programmable superconducting cell, the method comprising applying at least one pulse of energy to the superconducting cell that causes a nanowire constriction in a superconducting loop to transition from a superconducting state to a normal resistive state.

(19) The method of (18), wherein the energy of the at least one pulse is selected to cause a single flux quantum transition from a first memory state of the programmable superconducting cell to a second memory state of the programmable superconducting cell that is adjacent in energy to the first memory state.

(20) The method of (19), further comprising applying at least one additional pulse that causes a single flux quantum transition from the second memory state of the programmable superconducting cell to a third memory state of the programmable superconducting cell that is adjacent in energy to the second memory state and different from the first memory state.

(21) The method of any one of (18) through (20), wherein the at least one pulse is an optical pulse applied to the nanowire constriction.

(22) The method of any one of (18) through (20), wherein the at least one pulse comprises two electrical pulses that are timed to arrive at the constriction concurrently, such that the sum of energy from the two pulses causes the nanowire constriction to transition from the superconducting state to the normal resistive state whereas energy from one of the two pulses does not cause the nanowire constriction to transition from the superconducting state to the normal resistive state.

(23) The method of any one of (18) and (20) through (22), wherein the energy of the at least one pulse is selected to cause a multi-flux quantum transition from a first memory state of the programmable superconducting cell to a second memory state of the programmable superconducting cell.

(24) A method of multiplying or dividing with a programmable superconducting cell, the method comprising applying a current ramp to a biasing terminal that is coupled to a superconducting current loop of the programmable superconducting cell; and integrating an amount of current output from an output terminal coupled to the superconducting current loop.

(25) The method of (24), further comprising programming an amount of current circulating in the superconducting current loop.

(26) The method of (24) or (25), wherein the programming comprises causing a nanowire constriction formed in the current loop to transition from a superconducting state to a normal resistive state.

(27) A method of performing deep neural network calculations with an array of programmable superconducting cells, the method comprising performing a forward-pass multiplication of a vector times a matrix wherein vector inputs are provided as current ramps applied to biasing arms that are connected in rows to superconducting current loops in the programmable superconducting cells and matrix values are stored as circulating currents in the superconducting current loops; and integrating output currents from output terminals connected in columns to the superconducting current loops.

(28) The method of (27), further comprising performing a backward-pass multiplication of the vector time a transpose of the matrix wherein the vector inputs are provided as inverted current ramps applied to the output terminals and the matrix values are unchanged in the superconducting current loops; and integrating output currents from the biasing terminals.

(29) A method of making a programmable superconducting cell, the method comprising forming a current loop from a superconducting material on a substrate; and forming a nanowire constriction in the current loop.

(30) The method of (29), further comprising forming a low-impedance shunt connected to the current loop in parallel with the nanowire constriction.

(31) The method of (29) or (30), further comprising forming an input terminal connected to the current loop; forming a biasing terminal connected to the current loop; and forming an output terminal connected to the current loop.

(32) The method of any one of (29) through (31), wherein the current loop, nanowire constriction, input terminal, biasing terminal, and output terminal are all formed from a same material.

CONCLUSION

Unless stated otherwise, the terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be implemented in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. A programmable superconducting cell comprising:
a current loop formed from a superconducting material; and
a nanowire constriction formed in the current loop; and
a low-impedance shunt connected to the current loop in parallel with the nanowire constriction;
wherein a resistance value of the low-impedance shunt is between 0.1 ohm and 10 ohms and an inductance value of the low-impedance shunt is between 0.1 picoHenry and 100 picoHenry.

2. The programmable superconducting cell of claim 1, further comprising:
an input terminal connected to the current loop;
an output terminal connected to the current loop; and
a biasing arm and bias terminal connected to the current loop.

3. The programmable superconducting cell of claim 2, wherein the biasing arm is formed from the superconducting material and forms a portion of a yTron that is integrated in the current loop.

4. The programmable superconducting cell of claim 3, wherein a width of the biasing arm is greater than a width of the nanowire constriction.

5. The programmable superconducting cell of claim 3, further comprising a resistor connected to the bias terminal having a value between 10 ohms and 75 ohms.

6. The programmable superconducting cell of claim 1, wherein a width of the nanowire constriction is between 10 nm and 200 nm.

7. The programmable superconducting cell of claim 2 configured for multi-level memory.

8. The programmable superconducting cell of claim 2 configured for multiplication and/or division operations.

9. An array of programmable superconducting cells, each programmable superconducting cell comprising:
a current loop formed from a superconducting material;
a nanowire constriction formed in the current loop; and
a low-impedance shunt connected to the current loop in parallel with the nanowire constriction;
wherein a resistance value of the low-impedance shunt is between 0.1 ohm and 10 ohms and an inductance value of the low-impedance shunt is between 0.1 picoHenry and 100 picoHenry.

10. The array of claim 9, configured for multi-level memory storage.

11. The array of claim 9, configured for vector-matrix multiplication.

12. The array of claim 9, configured in a crossbar architecture for deep neural network computation.

13. The array of claim 9, wherein each programmable superconducting cell further comprises:
an input terminal connected to the current loop;
an output terminal connected to the current loop; and
a biasing arm, resistor, and bias terminal connected to the current loop.

14. The array of claim 13, further comprising:
first lines connecting the input terminals in first rows;
second lines connecting the output terminals in columns; and
third lines connecting the bias terminals in second rows.

15. The array of claim 14, wherein the second lines and third lines are configured as input/output lines.

16. A method of programming a memory state of a programmable superconducting cell, the method comprising applying at least one pulse of energy to the superconducting cell that causes a nanowire constriction in a superconducting loop to transition from a superconducting state to a normal resistive state;
wherein the at least one pulse comprises two electrical pulses that are timed to arrive at the constriction concurrently, such that the sum of energy from the two pulses causes the nanowire constriction to transition from the superconducting state to the normal resistive state whereas energy from one of the two pulses does not cause the nanowire constriction to transition from the superconducting state to the normal resistive state.

17. The method of claim 16, wherein the energy of the at least one pulse is selected to cause a single flux quantum transition from a first memory state of the programmable superconducting cell to a second memory state of the programmable superconducting cell that is adjacent in energy to the first memory state.

18. The method of claim 17, further comprising applying at least one additional pulse that causes a single flux quantum transition from the second memory state of the programmable superconducting cell to a third memory state of the programmable superconducting cell that is adjacent in energy to the second memory state and different from the first memory state.

19. The method of claim 16, wherein the at least one pulse is an optical pulse applied to the nanowire constriction.

20. The method of claim 16, wherein the energy of the at least one pulse is selected to cause a multi-flux quantum transition from a first memory state of the programmable superconducting cell to a second memory state of the programmable superconducting cell.

21. A method of multiplying or dividing with a programmable superconducting cell, the method comprising:
applying a current ramp to a biasing terminal that is coupled to a superconducting current loop, having a nanowire constriction formed therein, of the programmable superconducting cell; and
integrating an amount of current output from an output terminal coupled to the superconducting current loop;
wherein a low-impedance shunt connected to the current loop in parallel with the nanowire constriction; and
wherein a resistance value of the low-impedance shunt is between 0.1 ohm and 10 ohms and an inductance value of the low-impedance shunt is between 0.1 picoHenry and 100 picoHenry.

22. The method of claim 21, further comprising programming an amount of current circulating in the superconducting current loop.

23. The method of claim 22, wherein the programming comprises causing the nanowire constriction formed in the current loop to transition from a superconducting state to a normal resistive state.

24. A method of performing deep neural network calculations with an array of programmable superconducting cells, the method comprising:
performing a forward-pass multiplication of a vector times a matrix wherein vector inputs are provided as current ramps applied to biasing arms that are connected in rows to superconducting current loops in the programmable superconducting cells and matrix values are stored as circulating currents in the superconducting current loops; and
integrating output currents from output terminals connected in columns to the superconducting current loops.

25. The method of claim 24, further comprising:
performing a backward-pass multiplication of the vector time a transpose of the matrix wherein the vector inputs are provided as inverted current ramps applied to the output terminals and the matrix values are unchanged in the superconducting current loops; and
integrating output currents from the biasing terminals.

26. A method of making a programmable superconducting cell, the method comprising:
forming a current loop from a superconducting material on a substrate;
forming a nanowire constriction in the current loop; and
forming a low-impedance shunt connected to the current loop in parallel with the nanowire constriction;
wherein a resistance value of the low-impedance shunt is between 0.1 ohm and 10 ohms and an inductance value of the low-impedance shunt is between 0.1 picoHenry and 100 picoHenry.

27. The method of claim 26, further comprising:
forming an input terminal connected to the current loop;
forming a biasing terminal connected to the current loop; and
forming an output terminal connected to the current loop.

28. The method of claim 27, wherein the current loop, nanowire constriction, input terminal, biasing terminal, and output terminal are all formed from a same material.

* * * * *